(12) United States Patent
Inoue et al.

(10) Patent No.: US 6,870,385 B2
(45) Date of Patent: Mar. 22, 2005

(54) ANISOTROPIC CONDUCTIVE SHEET AND WAFER INSPECTION DEVICE

(75) Inventors: Kazuo Inoue, Tokyo (JP); Hisao Igarashi, Tokyo (JP)

(73) Assignee: JSR Corporation, Tokyo (JP)

( * ) Notice: Subject to any disclaimer, the term of this patent is extended or adjusted under 35 U.S.C. 154(b) by 119 days.

(21) Appl. No.: 10/432,606

(22) PCT Filed: Dec. 5, 2001

(86) PCT No.: PCT/JP01/10641
§ 371 (c)(1),
(2), (4) Date: Jun. 3, 2003

(87) PCT Pub. No.: WO02/47149
PCT Pub. Date: Jun. 13, 2002

(65) Prior Publication Data
US 2004/0028893 A1 Feb. 12, 2004

(30) Foreign Application Priority Data
Dec. 8, 2000 (JP) .................................. 2000-374561

(51) Int. Cl.[7] ................. G01R 31/26; G01R 31/02; H01R 12/00
(52) U.S. Cl. .................. 324/765; 324/754; 439/68
(58) Field of Search .................. 324/713, 691, 324/649, 600, 754, 765, 755, 757, 761, 762, 758, 557–559; 438/27, 46; 439/55, 66, 86, 91, 586, 591; 252/512, 514; 257/9, 613; 428/328, 332

(56) References Cited

U.S. PATENT DOCUMENTS 5,847,572 A * 12/1998 Iwasaki et al. ............. 324/755
6,103,359 A * 8/2000 Doi ............................ 428/323

(List continued on next page.)

FOREIGN PATENT DOCUMENTS

| JP | 9-223860 | 8/1997 |
|---|---|---|
| JP | 11-40224 | 2/1999 |
| JP | 2000-322938 | 11/2000 |
| JP | 2000-334742 | 12/2000 |

*Primary Examiner*—N. Le
*Assistant Examiner*—Hoai-An D. Nguyen
(74) *Attorney, Agent, or Firm*—Oblon, Spivak, McClelland, Maier & Neustadt, P.C.

(57) ABSTRACT

Disclosed herein are a wafer inspection apparatus which is small in size, prevented from shortening the service life of its circuit board for inspection, can collectively perform inspection as to a great number of electrodes to be inspected, has good electrical properties and can perform electrical inspection of high functional integrated circuits, and an anisotropically conductive sheet suitable for use in this wafer inspection apparatus. The anisotropically conductive sheet is composed of an insulating sheet body, in which a through-hole has been formed, and an elastic anisotropically conductive film arranged in the through-hole. The insulating sheet body is formed of a material having a modulus of elasticity of $1 \times 10^8$ to $1 \times 10^{10}$ Pa, a coefficient of linear thermal expansion of $3 \times 10^{-6}$ to $3 \times 10^{-5}$ $K^{-1}$ and a saturation magnetization lower than 0.1 wb/m$^2$, the elastic anisotropically conductive film is composed of a plurality of conductive path-forming portions and insulating portions formed among these conductive path-forming portions, the conductive path-forming portions are obtained by filling conductive particles having a number average particle diameter of 30 to 150 μm, a coating layer composed of a noble metal and having a thickness of at least 20 nm is formed on surfaces of the conductive particles, each of the conductive path-forming portions has a durometer hardness of 15 to 45, and an electric resistance between conductive path-forming portions is at least 10 MΩ.

14 Claims, 8 Drawing Sheets

U.S. PATENT DOCUMENTS

| | | |
|---|---|---|
| 6,168,442 B1 | 1/2001 | Naoi |
| 6,172,878 B1 * | 1/2001 | Takabayashi et al. ........ 361/760 |
| 6,204,681 B1 * | 3/2001 | Nagatsuka et al. .......... 324/761 |
| 6,394,821 B1 * | 5/2002 | Matsumura et al. .......... 439/91 |
| 6,566,899 B2 * | 5/2003 | Tamaru et al. .............. 324/754 |
| 6,597,192 B2 * | 7/2003 | Yamaguchi et al. ......... 324/765 |
| 6,669,869 B2 * | 12/2003 | Yamaguchi et al. ......... 252/512 |
| 6,690,564 B1 | 2/2004 | Haruta et al. |
| 6,720,787 B2 * | 4/2004 | Kimura et al. .............. 324/765 |

\* cited by examiner

ANISOTROPIC CONDUCTIVE SHEET AND WAFER INSPECTION DEVICE

TECHNICAL FIELD

The present invention relates to a wafer inspection apparatus and an anisotropically conductive sheet suitable for use in the wafer inspection apparatus, and particularly to a wafer inspection apparatus for collectively conducting a probe test as to a part or the whole of a great number of integrated circuits formed on a wafer or a wafer inspection apparatus for collectively conducting a burn-in test as to the whole of a great number of integrated circuits formed on a wafer, and an anisotropically conductive sheet suitable for use in these wafer inspection apparatus.

BACKGROUND ART

In the production process of semiconductor integrated circuit devices, after a great number of integrated circuits are formed on a wafer, a probe test is generally conducted as to each of these integrated circuits. This wafer is then cut, thereby forming semiconductor chips. Such semiconductor chips are contained and sealed in respective proper packages. Each of the packaged semiconductor integrated circuit devices is further subjected to a burn-in test. In order to give a quality certification to a semiconductor integrated circuit device, it is extremely important to not only inspect electrical properties of the semiconductor integrated circuit device by the burn-in test, but also inspect electrical properties of a semiconductor chip itself. Besides, in recent years, there has been developed a mounting method that uses a semiconductor chip itself as an integrated circuit device and directly mount the circuit device composed of the semiconductor chip on a printed circuit board. Therefore, there is a demand for guaranteeing the quality of the semiconductor chip itself.

It takes a long time to conduct inspection of the circuit device composed of the semiconductor chip, and inspection cost becomes considerably high because the semiconductor chip is minute, and its handling is inconvenient.

From such reasons, attention has been recently paid to a WLBI (wafer level burn-in) test in which the electrical properties of the circuit board composed of the semiconductor chip are inspected in the state of a wafer.

FIG. 13 is a cross-sectional view schematically illustrating the construction of an exemplary conventional wafer inspection apparatus for conducting the WLBI test as to a wafer on which a great number of integrated circuits have been formed.

This wafer inspection apparatus has a controller 85 having an input-output terminal part 86 in which a great number of input-output terminals 87 have been arranged. This controller 85 serves to perform temperature control of a wafer 1 for the purpose of conducting the inspection of the wafer 1 at a prescribed temperature, supply an electric power for conducting the inspection of the wafer 1, make input-output control of signals and detect output signals from the wafer 1 to judge the quality of integrated circuits on the wafer 1.

A disk-like circuit board 80 for inspection is provided below the controller 85. A leading terminal part 81, in which a great number of leading terminals 82 have been arranged in accordance with a pattern corresponding to a pattern of the input-output terminals 87 in the controller 85, is formed at a peripheral edge portion in one surface (upper surface in FIG. 13) of the circuit board 80 for inspection. An inspection electrode part (not illustrated), in which a great number of inspection electrodes (not illustrated) electrically connected to the respective leading terminals 81 through a circuit in the circuit board 80 for inspection have been arranged, is formed at a central portion of said one surface of the circuit board 80 for inspection. The circuit board 80 for inspection is arranged in a state held by a proper holding member in such a manner that the respective leading terminals 82 are opposed to the input-output terminals 87 of the controller 85.

A contact member 83 having a great number of contactors (not illustrated) brought into contact with electrodes (not illustrated) to be inspected of the integrated circuit in the wafer 1 as an object of the inspection is arranged on the inspection electrode part in said one surface of the circuit board 80 for inspection, and the each of the contactors of this contact member 83 are electrically connected to the respective inspection electrodes of the circuit board 80 for inspection.

A connector 84, in which a great number of connecting pins 84a capable of being elastically compressed in a lengthwise direction thereof, which are called "pogo pins", have been arranged, is arranged between the leading terminal part 81 of the circuit board 80 for inspection and the input-output terminal part 86 of the controller 85 in a state that the connecting pins 84a have been pressed in the lengthwise direction against the respective input-output terminals 87 of the controller 85 by means of a proper pressing mechanism (not illustrated), and the leading terminals 82 of the circuit board 80 for inspection are electrically connected to the input-output terminals 87 of the controller 85 by this connector 84.

FIG. 14 is a cross-sectional view schematically illustrating the construction of another exemplary conventional wafer inspection apparatus for conducting the WLBI test as to a wafer on which a great number of integrated circuits have been formed. In this wafer inspection apparatus, a controller 95 having a surface (upper surface in FIG. 14) of an area greater than a circuit board 80 for inspection is provided, the circuit board 80 for inspection is arranged at a central portion of said one surface of the controller 95, and a contact member 83 having a great number of contactors (not illustrated) is arranged on an inspection electrode part (not illustrated) in the circuit board 80 for inspection.

An input-output terminal part 96, in which a great number of input-output terminals 97 have been arranged, is formed at a peripheral edge portion in said one surface of the controller 95, and a connector 90 composed of a flexible printed wiring board having a great number of connection terminals 91 and 92 arranged in accordance with patterns corresponding to patterns of the each of the leading terminals 82 and the input-output terminals 97 is arranged on the leading terminal part 81 of the circuit board 80 for inspection and the input-output terminal part 96 of the controller 95 in such a manner that the each of the connection terminals 91 and 92 are opposed to the respective leading terminals 82 and the input-output terminals 97. The connector 90 is fixed to the leading terminal part 81 of the circuit board 80 for inspection and the input-output terminal part 96 of the controller 95 with anisotropically conductive adhesives 93 and 94, respectively, and the connection terminals 91 and 92 of the connector 90 are electrically connected to the leading terminals 82 of the circuit board 80 for inspection and the input-output terminals 97 of the controller 95, respectively.

In the wafer inspection apparatus shown in FIG. 13 or FIG. 14, the wafer 1 as an object of the inspection is held by a wafer holder 88 combined with a heating plate, and the wafer holder 88 is pressed downward by proper means, whereby the contactors of the contact member 83 are brought into contact with respective electrodes to be inspected of all integrated circuits formed on the wafer 1, thereby achieving necessary electrical connection. After the wafer 1 is heated to a prescribed temperature by the wafer holder 88 and held for a long period of time in this state, necessary electrical inspection (burn-in test) as to the wafer 1 is performed.

On the other hand, in the probe test conducted on integrated circuits formed on a wafer, a method, in which a probe test is collectively performed on, for example, 16 or 32 integrated circuits among a great number of integrated circuits formed on a wafer, and the probe test is successively performed on other integrated circuits, is generally adopted.

In recent years, there has been a demand for collectively performing a probe test on, for example, 64 or 124 integrated circuits, or all integrated circuits among a great number of integrated circuits formed on a wafer for the purpose of improving inspection efficiency and reducing inspection cost.

FIG. 15 is a cross-sectional view schematically illustrating the construction of an exemplary conventional wafer inspection apparatus for conducting the probe test as to a great number of integrated circuits formed on a wafer.

A circuit board 80 for inspection in this wafer inspection apparatus has a leading terminal part 81, in which a great number of leading terminals 82 have been arranged correspondingly to input-output terminals 87 in a controller 85, on one surface (upper surface in FIG. 15) and an inspection electrode part (not illustrated), in which a great number of inspection electrodes (not illustrated) electrically connected to the respective leading terminals 82 by a circuit in the circuit board 80 for inspection have been arranged, on the other surface, and is held by a holding member 74.

On the inspection electrode part in the other surface of the circuit board 80 for inspection, is arranged a contact member 83 having a great number of contactors (not illustrated) brought into contact with electrodes (not illustrated) to be inspected of integrated circuits on a wafer 1 as an object of the inspection. The respective contactors of this contact member 83 are electrically connected to the respective inspection electrodes of the circuit board 80 for inspection.

A wafer tray 89 combined with a heating plate, on which the wafer 1 as the object of the inspection is mounted, is arranged under the contact member 83.

A circuit board 75 for connection is provided between the controller 85 and the circuit board 80 for inspection. The circuit board 75 for connection has one-side connecting electrode part 76, in which a great number of one-side connecting electrodes 77 have been arranged in accordance with a pattern corresponding to a pattern of the input-output terminals 87 in the controller 85, on one surface (upper surface in FIG. 15) thereof and the other-side connecting electrode part 78, in which a great number of other-side connecting electrodes 79 have been arranged in accordance with a pattern corresponding to a pattern of the leading terminals 82 in the circuit board 80 for inspection, on the other surface thereof. The circuit board 75 for connection is arranged in a state held by a holding member 74 in such a manner that the one-side connecting electrodes 77 are respectively opposed to the input-output terminals 87 of the controller 85, and the other-side connecting electrodes 79 are respectively opposed to the leading terminals 82 of the circuit board 80 for inspection.

A first connector 70, in which a great number of connecting pins 71 capable of being elastically compressed in a lengthwise direction thereof have been arranged, is arranged between the input-output terminal part 86 of the controller 85 and the one-side connecting electrode part 76 of the circuit board 75 for connection in a state that the connecting pins 71 have been pressed in the lengthwise direction by a proper pressing mechanism (not illustrated), and the input-output terminals 87 of the controller 85 are electrically connected to the one-side connecting electrodes 77 of the circuit board 75 for connection by this first connector 70.

A second connector 72, in which a great number of connecting pins 73 capable of being elastically compressed in a lengthwise direction thereof have been arranged, is arranged between the leading terminal part 81 of the circuit board 80 for inspection and the other-side connecting electrode part 78 of the circuit board 75 for connection in a state that the connecting pins 73 have been pressed in the lengthwise direction by the pressing mechanism, and the leading terminals 82 of the circuit board 80 for inspection are electrically connected to the other-side connecting electrodes 79 of the circuit board 75 for connection by this second connector 72.

In the wafer inspection apparatus shown in FIG. 15, the wafer 1 as the object of the inspection is mounted on the wafer tray 89, and the wafer tray 89 is moved upward by proper means, whereby the contactors of the contact member 83 are brought into contact with the respect electrodes to be inspected of a part of the integrated circuits formed on the wafer 1, thereby achieving necessary electrical connection. The wafer 1 is then heated to a prescribed temperature by the wafer tray 89 to perform necessary electrical inspection (probe test) as to the wafer 1 in this state.

The conventional wafer inspection apparatus shown in FIGS. 13 to 15 involve the following respective problems.

(1) In the wafer inspection apparatus shown in FIGS. 13 and 15, it is necessary to press the connecting pins under pressing force of about 0.8 N (about 0.08 kgw) per pin for the purpose of achieving stable electrical connection of the input-output terminals 87 of the controller 85 to the respective leading terminals 82 of the circuit board 80 for inspection. Accordingly, when the number of, for example, leading terminals 82 of the circuit board 80 for inspection is, for example, 5,000, pressing force of about 4,000 N is required as a whole. Therefore, the apparatus involve a problem that a pressing mechanism for applying such pressing force inevitably becomes large in size, and a large-scaled member that withstands great pressing force is also required for the holding member for the circuit board 80 for inspection, so that the whole wafer inspection apparatus becomes considerably large in size.

The apparatus also involve a problem that the service life of the circuit board 80 for inspection is shortened because the each of the leading terminals 82 of the circuit board 80 for inspection are pressed under great pressing force by the connecting pins, whereby the respective leading terminals 82 are easy to be damaged, and in turn, inspection cost is increased.

There is a limit to reduce a length of the connecting pins from the constraint of mechanism, and the connecting pins are required to have a length of about 3 cm in reality. Therefore, a clearance between the circuit board 80 for inspection and the controller 85 becomes considerably long. As a result, it is difficult to reduce the size of the wafer inspection apparatus in a height-wise direction. In this respect, the apparatus also involve a problem that the miniaturization of the wafer inspection apparatus as a whole cannot be contrived. In particular, there has recently been proposed a wafer inspection apparatus constructed by stacking a plurality of inspection units each composed of the components shown in, for example, FIG. 13 for the purpose of performing inspection as to a plurality of wafers in a small operating space in parallel. In such a wafer inspection apparatus, it is extremely important from the viewpoint of miniaturizing the apparatus to reduce the size of each inspection unit in a height-wise direction because the whole wafer inspection apparatus becomes considerably large when the size of each inspection unit in the height-wise direction is large.

Since the connecting pins require to have a considerably long length, a distance of a signal transmission system becomes considerably long, so that a problem that the apparatus are difficult to be applied to electrical inspection as to high functional integrated circuits of which high-speed processing is required arises.

(2) In the wafer inspection apparatus shown in FIG. 14, the leading terminals 82 of the circuit board 80 for inspection are electrically connected to the respective input-output terminals 97 of the controller 95 by the connector 90 composed of the flexible printed wiring board, so that it is difficult to arrange the leading terminal 82 at a high density. Accordingly, the apparatus involves a problem that it is difficult to collectively conduct inspection as to a great number of electrodes to be inspected because only about 2,000 leading terminals can be formed on the circuit board 80 for inspection.

Since electrical connection between the connecting terminals 91 of the connector 90 and the leading terminals 82 of the circuit board 80 for inspection and electrical connection between the connecting terminals 92 of the connector 90 and the input-output terminals 97 of the controller 95 are achieved by the anisotropically conductive adhesives 93 and 94, respectively, contact resistance becomes considerably high. Accordingly, a problem that good electrical properties cannot be achieved arises.

DISCLOSURE OF THE INVENTION

The present invention has been made on the basis of the foregoing circumstances and has as its object the provision of a wafer inspection apparatus which is suitable for use in conducting electrical inspection of a great number of integrated circuits formed on a wafer, which can be miniaturized as a whole, is prevented from shortening the service life of its circuit board for inspection, can collectively perform inspection as to a great number of electrodes to be inspected, has good electrical properties and can perform electrical inspection of high functional integrated circuits, and an anisotropically conductive sheet suitable for use in this wafer inspection apparatus.

According to the present invention, there is thus provided an anisotropically conductive sheet comprising:

an insulating sheet body, in which a through-hole extending in a thickness-wise direction thereof has been formed, and an elastic anisotropically conductive film arranged in the through-hole in the insulating sheet body and supported by an inner peripheral edge portion about the through-hole, wherein the insulating sheet body is composed of a material having a modulus of elasticity of $1\times10^8$ to $1\times10^{10}$ Pa, a coefficient of linear thermal expansion of $3\times10^{-6}$ to $3\times10^{-5}$ $K^{-1}$ and a saturation magnetization lower than 0.1 wb/m$^2$, wherein the elastic anisotropically conductive film is composed of a plurality of conductive path-forming portions each extending in a thickness-wise direction of the film and arranged along a plane direction of the film in a state separated from each other and insulating portions formed between these conductive path-forming portions, the conductive path-forming portions are obtained by filling conductive particles having a number average particle diameter of 30 to 150 μm and exhibiting magnetism at a high density in an elastic polymeric substance, and a coating layer composed of a noble metal and having a thickness of at least 20 nm is formed on surfaces of the conductive particles, and wherein each of the conductive path-forming portions has a durometer hardness of 15 to 45, and an electric resistance between conductive path-forming portions adjacent to each other is at least 10 MΩ.

According to the present invention, there is also provided an anisotropically conductive sheet comprising:

an insulating sheet body, in which a plurality of through-holes each extending in a thickness-wise direction thereof have been formed, and a plurality of elastic anisotropically conductive films arranged in the respective through-holes in the insulating sheet body and supported by the inner peripheral edge portions about corresponding through-holes, wherein the insulating sheet body is composed of a material having a modulus of elasticity of $1\times10^8$ to $1\times10^{10}$ Pa, a coefficient of linear thermal expansion of $3\times10^{-6}$ to $3\times10^{-5}$ $K^{-1}$ and a saturation magnetization lower than 0.1 wb/m$^2$, wherein each of the elastic anisotropically conductive films is composed of a conductive path-forming portion extending in a thickness-wise direction of the film and an insulating portion formed about the conductive path-forming portion, the conductive path-forming portion is obtained by filling conductive particles having a number average particle diameter of 30 to 150 μm and exhibiting magnetism at a high density in an elastic polymeric substance, and a coating layer composed of a noble metal and having a thickness of at least 20 nm is formed on surfaces of the conductive particles, and wherein the conductive path-forming portion in each of the elastic anisotropically conductive films has a durometer hardness of 15 to 45, and an electric resistance between the conductive path-forming portions adjacent to each other of elastic anisotropically conductive films is at least 10 MΩ.

In the anisotropically conductive sheets according to the present invention, an allowable current value of each of the conductive path-forming portions when the conductive path-forming portion is pressed in the thickness-wise direction thereof under a load of 40 g may preferably be at least 3 A.

An allowable current value of each of the conductive path-forming portions when the conductive path-forming portion is pressed in the thickness-wise direction thereof so as to give a distortion factor of 10% may preferably be at least 1 A.

In the anisotropically conductive sheets according to the present invention, it may be preferable that an electric resistance of each of the conductive path-forming portions in the thickness-wise direction thereof as measured in a state that the conductive path-forming portion has been pressed in the thickness-wise direction under a load of 40 g be at most 0.1 Ω, and an electric resistance of the conductive path-forming portion in the thickness-wise direction thereof as measured in a state that the conductive path-forming portion has been pressed in the thickness-wise direction under a load of 40 g, after a cycle that the conductive path-forming portion is pressed for 15 minutes in the thickness-wise direction under a load of 40 g and then held for 5 minutes in an unloaded state in an environment of 100° C. in temperature was repeated for 3,000 times be at most 0.1 Ω.

In the anisotropically conductive sheets according to the present invention, it may be preferable that an electric resistance of each of the conductive path-forming portions in the thickness-wise direction thereof as measured in a state that the conductive path-forming portion has been pressed in the thickness-wise direction so as to give a distortion factor of 10% be at most 0.1 Ω, and an electric resistance of the conductive path-forming portion in the thickness-wise direction thereof as measured after a current of 1 A is applied to the conductive path-forming portion for 3,000 hours in a state that the conductive path-forming portion had been pressed in the thickness-wise direction so as to give a distortion factor of 10% in an environment of 100° C. in temperature be at most 0.1 Ω.

According to the present invention, there is further provided a wafer inspection apparatus for performing electrical inspection of a great number of integrated circuits formed on a wafer, which comprises:

a controller having an input-output terminal part, in which a great number of input-output terminals have been arranged, a circuit board for inspection having a leading terminal part, in which a great number of leading terminals have been arranged on one surface thereof in accordance with a pattern corresponding to a pattern of the input-output terminals in the controller so that the each of the leading terminals is opposed to the respective input-output terminals of the controller, a contact member arranged on said one surface or the other surface of the circuit board for inspection and having a great number of contactors electrically connected to the respective leading terminals through a circuit in the circuit board for inspection and brought into contact with electrodes to be inspected of the integrated circuits on the wafer as an object of the inspection, and a connector arranged between the input-output terminal part of the controller and the leading terminal part of the circuit board for inspection to electrically connect the each of the input-output terminals to the respective leading terminals, wherein the connector is composed of the anisotropically conductive sheets described above.

In the wafer inspection apparatus, the connector may preferably be constructed by arranging a plurality of the anisotropically conductive sheets described above so as to align along the surface of the leading terminal part of the circuit board for inspection.

According to the present invention, there is still further provided a wafer inspection apparatus for performing electrical inspection of a great number of integrated circuits formed on a wafer, which comprises:

a controller having an input-output terminal part, in which a great number of input-output terminals have been arranged, a circuit board for inspection having a leading terminal part, in which a great number of leading terminals have been arranged, on one surface thereof, a contact member arranged on the other surface of the circuit board for inspection and having a great number of contactors electrically connected to the respective leading terminals through a circuit in the circuit board for inspection and brought into contact with electrodes to be inspected of the integrated circuits on the wafer as an object of the inspection, a circuit board for connection having one-side connecting electrode part, in which a great number of one-side connecting electrodes have been arranged on one surface thereof in accordance with a pattern corresponding to a pattern of the input-output terminals of the controller so that the each of the one-side connecting electrodes is opposed to the respective input-output terminals of the controller, and the other-side connecting electrode part, in which a great number of other-side connecting electrodes have been arranged on the other surface thereof in accordance with a pattern corresponding to a pattern of the leading terminals of the circuit board for inspection so that the each of the other-side connecting electrodes is opposed to the respective leading terminals of the circuit board for inspection, a first connector arranged between the input-output terminal part of the controller and the one-side connecting electrode part of the circuit board for connection to electrically connect the each of the input-output terminals to the respective one-side connecting electrodes, and a second connector arranged between the leading terminal part of the circuit board for inspection and the other-side connecting electrode part of the circuit board for connection to electrically connect the each of the leading terminals to the respective other-side connecting electrodes, wherein at least one of the first and second connectors is composed of the anisotropically conductive sheets described above.

According to the present invention, there is yet still further provided a wafer inspection apparatus for performing electrical inspection of a great number of integrated circuits formed on a wafer, which comprises:

a controller having an input-output terminal part, in which a great number of input-output terminals have been arranged, a circuit board for inspection having a leading terminal part, in which a great number of leading terminals have been arranged, on one surface thereof, a contact member arranged on the other surface of the circuit board for inspection and having a great number of contactors electrically connected to the respective leading terminals through a circuit in the circuit board for inspection and brought into contact with electrodes to be inspected of the integrated circuits on the wafer as an object of the inspection, a circuit board for connection having one-side connecting electrode part, in which a great number of one-side connecting electrodes have been arranged on one surface thereof in accordance with a pattern corresponding to a pattern of the input-output terminals of the controller so that the each of the one-side connecting electrodes is opposed to the respective input-output terminals of the controller, and the other-side connecting electrode part, in which a great number of other-side connecting electrodes have been arranged on the other surface thereof in accordance with a pattern corresponding to a pattern of the leading terminals of the circuit board for inspection so that the each of the other-side connecting electrodes is opposed to the respective leading terminals of the circuit board for inspection, a first connector arranged between the input-output terminal part of the controller and the one-side connecting electrode part of the circuit board for connection to electrically connect the each of the input-output terminals to the respective one-side connecting electrodes, and a second connector arranged between the leading terminal part of the circuit board for inspection and the other-side connecting electrode part of the circuit board for connection to electrically connect the each of the leading terminals to the respective other-side connecting electrodes, wherein either one or both of the first and second connectors are constructed by arranging a plurality of the anisotropically conductive sheets described above so as to align along the surface of the one-side connecting electrode part or other-side connecting electrode part of the circuit board for connection.

According to the anisotropically conductive sheets of the present invention, each of the anisotropically conductive sheets has the insulating sheet body whose modulus of elasticity falls within the specific value range, whereby it does not greatly deform when the peripheral edge portion of the insulating sheet body is held, so that positioning operation of the anisotropically conductive sheet to electrodes intended to be connected can be conducted with ease.

Since the insulating sheet body is composed of the material having a low coefficient of linear thermal expansion, a good electrically connected state can be stably retained even in changes of temperature environment.

Since the specific conductive particles are filled in the conductive path-forming portions in the elastic anisotropically conductive film, and the durometer hardness of the conductive path-forming portions falls within the specific range, high conductivity is achieved, and moreover an electrically connected state to electrodes intended to be connected is stably achieved.

Since the electric resistance between the conductive path-forming portions is at least 10 MΩ, high reliability on connection to electrodes intended to be connected is achieved.

Accordingly, the anisotropically conductive sheets according to the present invention can be suitably used in a wafer inspection apparatus.

According to the wafer inspection apparatus of the present invention, the connector for electrically connecting the circuit board for inspection and the controller is constructed by the specific anisotropically conductive sheet, whereby the electrical connection of the leading terminals of the circuit board for inspection and the input-output terminals of the controller is surely achieved under small pressing force, so that there is no need of using a large-scaled mechanism as the pressing mechanism, and at the same time there is no need of using a large-scaled member as the holding member for the circuit board for inspection. In addition, since a separated distance between the circuit board for inspection and the controller is short, the size of the wafer inspection apparatus in the height-wise direction can be made small. Accordingly, the wafer inspection apparatus can be miniaturized as a whole.

Since the pressing force applied to the leading terminals of the circuit board for inspection is small, the leading terminals are not damaged, so that the circuit board for inspection is prevented from shortening the service life thereof.

The leading terminals of the circuit board for inspection are electrically connected by the specific anisotropically conductive sheet, whereby the leading terminals can be arranged at a high density. Accordingly, a great number of leading terminals can be formed, so that the inspection of a great number of electrodes to be inspected can be collectively performed.

In the electrical connection by the specific anisotropically conductive sheet, contact resistance is low, and a stable connected state can be achieved, so that good electrical properties can be achieved.

Since the leading terminals of the circuit board for inspection and the input-output terminals of the controller are electrically connected through the specific anisotropically conductive sheet, a distance of a signal transmission system can be made short, so that the wafer inspection apparatus can be applied to electrical inspection as to high functional integrated circuits of which high-speed processing is required.

DESCRIPTION OF CHARACTERS

Figure 1:
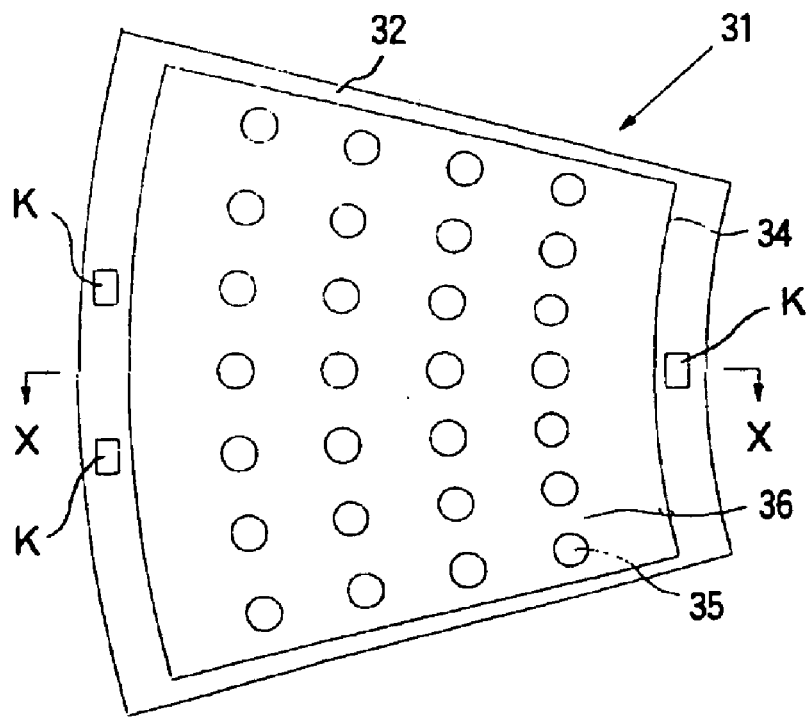
FIG. 1 is a plan view illustrating an exemplary anisotropically conductive sheet according to the present invention.

1 Wafer 10 Circuit board for inspection
15 Leading terminal part 16 Leading terminals
20 Contact member 21 Wafer holder
22 Wafer tray 25 Circuit board for inspection
26 One-side connecting electrode part
27 One-side connecting electrodes
28 Other-side connecting electrode part 29 Other-side connecting electrodes
30 Connector 30A First connector
30B Second connector
31 Anisotropically conductive sheet
32 Insulating sheet body 33 Through-hole
34 Elastic anisotropically conductive film
34A Molding material layer
35 Conductive path-forming portions
35A, 35B Projected portions 36 Insulating portion
40 Controller 41 Input-output terminal part
42 Input-output terminals 45 Holding member
50 Mold 51 Top force
52 Ferromagnetic base plate 53 Non-magnetic base plate
53A Recesses for receiving magnetic member
53B Recesses for forming projected portion
54A Spherical magnetic members 54B Lid member
55A, 55B Spacers 56 Bottom force
57 Ferromagnetic base plate 58 Non-magnetic base plate
58A Recesses for receiving magnetic member
58B Recesses for forming projected portion
59A Spherical magnetic members 59B Lid member
60 Mold 61 Top force
62 Ferromagnetic base plate
63 Ferromagnetic substance layers
64 Non-magnetic substance layers
66 Bottom force 67 Ferromagnetic base plate
68 Ferromagnetic substance layers
69 Non-magnetic substance layers
70 First connector 71 Connecting pins
72 Second connector 73 Connecting pins
74 Holding member 75 Circuit board for connection
76 One-side connecting electrode part
77 One-side connecting electrodes
78 Other-side connecting electrode part
79 Other-side connecting electrodes
80 Circuit board for inspection 81 Leading terminal part
82 Leading terminals 83 Contact member
84 Connector 84A Connecting pins
85 Controller 86 Input-output terminal part
87 Input-output terminals 88 Wafer holder
89 Wafer tray
90 Connector 91, 92 Connecting terminals
93, 94 Anisotropically conductive adhesives
95 Controller 96 Input-output terminal part
97 Input-output terminals P Conductive particles
100 One electrode plate for test
101 Patterned electrode 102 Leading electrodes
105 Other electrode plate for test
106 Common electrode 110 Voltmeter
115 DC power source
116 Constant-current controller
120 Spacer K Positioning holes

BEST MODE FOR CARRYING OUT THE INVENTION

The embodiments of the present invention will hereinafter be described in detail.

[Anisotropically Conductive Sheet]

Figure 2:
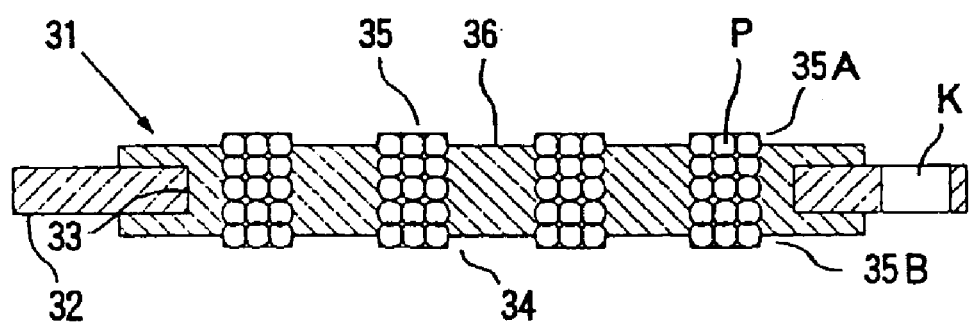
FIG. 2 is a cross-sectional view of the anisotropically conductive sheet taken along line X—X in FIG. 1.

FIG. 1 is a plan view illustrating an exemplary anisotropically conductive sheet according to the present invention, and FIG. 2 is a cross-sectional view of the anisotropically conductive sheet taken along line X—X in FIG. 1.

This anisotropically conductive sheet 31 is formed by an insulating sheet body 32 in the form of substantially a fan in a plane thereof, which has a through-hole 33 in the form of substantially a fan in a section extending in a thickness-wise direction thereof, and an elastic anisotropically conductive film 34 arranged in the through-hole 33 in the insulating sheet body 32 and supported by an inner peripheral edge portion about the through-hole 33. In the illustrated embodiment, a plurality of positioning holes K for positioning and arranging the anisotropically conductive sheet 31 are formed in peripheral edge portions of the insulating sheet body 32.

In the anisotropically conductive film 34, a plurality of conductive path-forming portions 35 each extending in a thickness-wise direction of the film are arranged in accordance with a pattern corresponding to a pattern of electrodes intended to be connected along a plane direction of the film in a state separated from each other. These conductive path-forming portions 35 are mutually insulated by insulating portions 36 interposed between them. In the illustrated embodiment, projected portions 35A and 35B respectively protruding from both surfaces of the insulating portion 36 are formed at each of the conductive path-forming portions 35.

Each of the conductive path-forming portions 35 is formed by filling conductive particles P exhibiting magnetism at a high density in an insulating elastic polymeric substance in a state oriented in the thickness-wise direction, and the insulating portions 36 are formed by the insulating elastic polymeric substance.

The insulating sheet body 32 is formed by a material having a modulus of elasticity of $1\times10^8$ to $1\times10^{10}$ Pa, preferably $5\times10^8$ to $5\times10^9$ Pa, a coefficient of linear thermal expansion of $3\times10^{-6}$ to $3\times10^{-5}$ K$^{-1}$, preferably $3.5\times10^{-6}$ to $2.5\times10^{-5}$ K$^{-1}$ and a saturation magnetization lower than 0.1 wb/m$^2$, preferably lower than 0.05 wb/m$^2$.

If the modulus of elasticity of the material forming the insulating sheet body 32 is lower than $1\times10^8$ Pa, the resulting anisotropically conductive sheet 31 becomes easy to flex, so that it is difficult to arrange the anisotropically conductive sheet 31 at a prescribed position by holding the peripheral edge portion thereof when the anisotropically conductive sheet 31 is used as a connector in a wafer inspection apparatus which will be described subsequently. If the modulus of elasticity of the material forming the insulating sheet body 32 exceeds $1\times10^{10}$ Pa on the other hand, the resulting insulating sheet body 32 becomes extremely hard, so that a circuit board or the like tends to be damaged when the insulating sheet body 32 comes into contact with the circuit board upon arranging the anisotropically conductive sheet 31 at a prescribed position by holding the peripheral edge portion thereof in the case where the anisotropically conductive sheet 31 is used as a connector in a wafer inspection apparatus which will be described subsequently.

If the coefficient of linear thermal expansion of the material forming the insulating sheet body 32 exceeds $3\times10^{-5}$ K$^{-1}$, it is difficult to stably retain a good electrically connected state because positional deviation between conductive path-forming portions 35 and electrodes intended to be connected occurs due to thermal expansion of the resulting anisotropically conductive sheet 31 when the temperature about the anisotropically conductive sheet 31 is raised by heating a wafer in the case where the anisotropically conductive sheet 31 is used as a connector in a wafer inspection apparatus which will be described subsequently.

If the saturation magnetization of the material forming the insulating sheet body 32 is 0.1 wb/m$^2$ or higher, the conductive particles in the molding material layer for forming the elastic anisotropically conductive film remain retained on the insulating sheet body 32 when a magnetic field is applied to the molding material layer in a production process which will be described subsequently, so that the resulting elastic anisotropically conductive film is difficult to surely achieve necessary insulating property due to the presence of unnecessary conductive particles on the insulating sheet body.

As specific examples of the material forming the insulating sheet body 32, may be mentioned resin materials having high mechanical strength, such as polyimide, polyester and polyamide, glass fiber-reinforced composite resin materials such as glass fiber-reinforced epoxy resins, glass fiber-reinforced polyester resins and glass fiber-reinforced polyimide resins, and composite resin materials obtained by filling an inorganic material such as silica, alumina or boron nitride into an epoxy resin or the like.

The thickness of the insulating sheet body 32 is preferably 0.05 to 2 mm, more preferably 0.1 to 1 mm. If this thickness is smaller than 0.05 mm, it is impossible to obtain any insulating sheet body 32 having sufficiently high strength. If the thickness exceeds 2 mm on the other hand, the thickness of the conductive path-forming portions 35 in the resulting elastic anisotropically conductive film 34 becomes considerably great, so that it is difficult to obtain conductive path-forming portions 35 having good conductivity.

As the elastic polymeric substance forming the conductive path-forming portions 35 and the insulating portions 36 in the elastic anisotropically conductive film 34, is preferred that having a crosslinked structure. As a curable polymeric substance-forming material for obtaining such a crosslinked elastic polymeric substance, may be used various materials. Specific examples thereof include silicone rubber, conjugated diene rubbers such as polybutadiene rubber, natural rubber, polyisoprene rubber, styrene-butadiene copolymer rubber and acrylonitrile-butadiene copolymer rubber, and hydrogenated products thereof; block copolymer rubbers such as styrene-butadiene-diene block copolymer rubber and styrene-isoprene block copolymers, and hydrogenated products thereof; and chloroprene, urethane rubber, polyester rubber, epichlorohydrin rubber, ethylene-propylene copolymer rubber, ethylene-propylene-diene copolymer rubber and soft liquid epoxy rubber.

Among these, silicone rubber is preferred from the viewpoints of molding and processing ability and electrical properties.

As the silicone rubber, is preferred that obtained by crosslinking or condensing liquid silicone rubber. The liquid silicone rubber preferably has a viscosity not higher than $10^5$ poises as measured at a shear rate of $10^{-1}$ sec and may be any of condensation type, addition type and those having a vinyl group or hydroxyl group. As specific examples thereof, may be mentioned dimethyl silicone raw rubber, methylvinyl silicone raw rubber and methylphenylvinyl silicone raw rubber.

Among these, vinyl group-containing liquid silicone rubber (vinyl group-containing dimethyl polysiloxane) is generally obtained by subjecting dimethyldichlorosilane or dimethyldialkoxysilane to hydrolysis and condensation reaction in the presence of dimethylvinylchlorosilane or dimethylvinylalkoxysilane and successively fractionating the reaction product by, for example, repeated dissolution-precipitation.

Liquid silicone rubber having vinyl groups at both terminals thereof is obtained by subjecting a cyclic siloxane such as octamethylcyclotetrasiloxane to anionic polymerization in the presence of a catalyst, using, for example, dimethyldivinylsiloxane as a polymerization terminator and suitably selecting other reaction conditions (for example, amounts of the cyclic siloxane and polymerization terminator). As the catalyst for the anionic polymerization, may be used an alkali such as tetramethylammonium hydroxide or n-butylphosphonium hydroxide or a silanolate solution thereof. The reaction is conducted at a temperature of, for example, 80 to 130° C.

Such a vinyl group-containing dimethyl polysiloxane preferably has a molecular weight Mw (weight average molecular weight as determined in terms of standard polystyrene; the same shall apply hereinafter) of 10,000 to 40,000. It also preferably has a molecular weight distribution index (a ratio Mw/Mn of weight average molecular weight Mw as determined in terms of standard polystyrene to number average molecular weight Mn as determined in terms of standard polystyrene; the same shall apply hereinafter) of at most 2 from the viewpoint of the heat resistance of the resulting anisotropically conductive sheet 31.

On the other hand, hydroxyl group-containing liquid silicone rubber (hydroxyl group-containing dimethyl polysiloxane) is generally obtained by subjecting dimethyldichlorosilane or dimethyldialkoxysilane to hydrolysis and condensation reaction in the presence of dimethylhydrochlorosilane or dimethylhydroalkoxysilane and successively fractionating the reaction product by, for example, repeated dissolution-precipitation.

The hydroxyl group-containing liquid silicone rubber is also obtained by subjecting a cyclic siloxane to anionic polymerization in the presence of a catalyst, using, for example, dimethylhydrochlorosilane, methyldihydrochlorosilane or dimethylhydroalkoxysilane as a polymerization terminator and suitably selecting other reaction conditions (for example, amounts of the cyclic siloxane and polymerization terminator). As the catalyst for the anionic polymerization, may be used an alkali such as tetramethylammonium hydroxide or n-butylphosphonium hydroxide or a silanolate solution thereof. The reaction is conducted at a temperature of, for example, 80 to 130° C.

Such a hydroxyl group-containing dimethyl polysiloxane preferably has a molecular weight Mw of 10,000 to 40,000. It also preferably has a molecular weight distribution index of at most 2 from the viewpoint of the heat resistance of the resulting anisotropically conductive sheet 31.

In the present invention, either one of the above-described vinyl group-containing dimethyl polysiloxane and hydroxyl group-containing dimethyl polysiloxane may be used, or both may be used in combination.

A curing catalyst for curing the polymeric substance-forming material may be contained in the polymeric substance-forming material. As such a curing catalyst, may be used an organic peroxide, fatty acid azo compound, hydrosilylated catalyst or the like.

Specific examples of the organic peroxide used as the curing catalyst include benzoyl peroxide, bisdicyclobenzoyl peroxide, dicumyl peroxide and di-tert-butyl peroxide.

Specific examples of the fatty acid azo compound used as the curing catalyst include azobisisobutyronitrile.

Specific examples of that used as the catalyst for hydrosilylation reaction include publicly known catalysts such as platinic chloride and salts thereof, platinum-unsaturated group-containing siloxane complexes, vinylsiloxane-platinum complexes, platinum-1,3-divinyltetramethyldisiloxane complexes, complexes of triorganophosphine or phosphine and platinum, acetyl acetate platinum chelates, and cyclic diene-platinum complexes.

The amount of the curing catalyst used is suitably selected in view of the kind of the polymeric substance-forming material, the kind of the curing catalyst and other curing treatment conditions. However, it is generally 3 to 15 parts by mass per 100 parts by mass of the polymeric substance-forming material.

In the polymeric substance-forming material, may be contained a general inorganic filler such as silica powder, colloidal silica, aerogel silica or alumina as needed. By containing such an inorganic filler, the thixotropic property of the resulting molding material, which will be described subsequently, is surely obtained, the viscosity thereof becomes high, the dispersion stability of the conductive particles is improved, and moreover the strength of the anisotropically conductive sheet 31 obtained by a curing treatment can be made high.

No particular limitation is imposed on the amount of such an inorganic filler used. However, the use in a too large amount is not preferred because the orientation of the conductive particles P by a magnetic field cannot be sufficiently achieved in the production process, which will be described subsequently.

The conductive particles P exhibiting magnetism, which forms the conductive path-forming portions 35, are obtained by forming a coating layer composed of a noble metal on surfaces of core particles exhibiting magnetism.

As a material forming the core particles, may be used that composed of a ferromagnetic metal such as nickel, iron, cobalt or an alloy thereof, that obtained by plating surfaces of inorganic substance particles such as non-magnetic metal particles or glass beads, or polymer particles with the ferromagnetic metal, or the like. As the noble metal forming the coating layer, may be used gold, silver, platinum palladium, rhodium, iridium, an alloy thereof or the like.

No particular limitation is imposed on the means for coating the surfaces of the core particles with the conductive metal, and the coating may be conducted by, for example, a wet process such as electroless plating, replacement plating or electroplating, or a dry process such as sputtering.

The thickness of the coating layer in the conductive particles P is at least 20 nm, preferably at least 30 nm, more preferably at least 50 nm. When the thickness of the coating layer is at least 20 nm, the conductivity of such conductive particles becomes sufficiently high, so that conductive path-forming portions having conductivity high in the thickness-wise direction can be surely obtained.

The thickness of the coating layer of the conductive particles herein is defined by that calculated out in accordance with the following numerical expression:

$$t=[1/(Sw \cdot \rho)] \times [N/(1-N)]$$

wherein t is the thickness (m) of the coating layer, Sw is a BET specific surface area (m$^2$/kg) of the core particles, $\rho$ is a specific gravity (kg/m$^3$) of the noble metal forming the coating layer, and N is a coating rate (weight of the coating layer/weight of the conductive particles) by the coating layer.

The above numerical expression is derived in the following manner.

(a) Supposing that the weight of the core particles is Mp (kg), the surface area S (m$^2$) of the core particles is found by the following equation:

$$S=Sw \cdot Mp \quad (1)$$

(b) Supposing that the weight of the coating layer is m (kg), the volume V (m$^3$) of the coating layer is found by the following equation:

$$V=m/\rho \quad (2)$$

(c) Assuming that the thickness of the coating layer is even over all surfaces of the conductive particles, t=V/S. When the above-described equations (1) and (2) are substituted into this equation, the thickness of the coating layer is determined by the following equation:

$$t=(m/\rho)/(Sw \cdot Mp)=m/(Sw \cdot \rho \cdot Mp) \quad (3)$$

(d) Since the coating rate N by the coating layer is a ratio of the weight of the coating layer to the weight of the conductive particles, the coating rate N is found by the following equation:

$$N=m/(Mp+m) \quad (4)$$

(e) When the numerator and the denominator in the right-hand side of the equation (4) is divided by Mp,
N=(m/MP)/(1+m/Mp) is given. When both sides are multiplied by (1+m/Mp),
N(1+m/Mp)=m/Mp, further
N+N(m/Mp)=m/Mp is obtained. By transporting N(m/Mp) into the right-hand side,
N=m/Mp−N(m/Mp)=(m/Mp)(1−N) is given. Both sides are divided by (1−N), and
N/(1−N)=m/Mp is given.

Accordingly, the weight Mp of the core particles is determined by the following equation:

$$Mp=m/[N/(1-N)]=m(1-N)/N \quad (5)$$

(f) When the equation (5) is substituted into the equation (3), $$t=1/[Sw \cdot \rho \cdot (1-N)/N]=[1/(Sw \cdot \rho)] \times [N/(1-N)] \text{ is driven.}$$

The coating rate N by the coating layer is preferably 2.5 to 50% by mass, more preferably 3 to 30% by mass, still more preferably 3.5 to 25% by mass, particularly preferably 4 to 20% by mass. When the noble metal coated is gold, the coating rate thereof is preferably 3 to 30% by mass, more preferably 3.5 to 25% by mass, still more preferably 4 to 20% by mass, particularly preferably 4.5 to 10% by mass.

The number average particle diameter of the conductive particles P is 30 to 150 μm, preferably 40 to 120 μm, more preferably 50 to 100 μm.

If the number average particle diameter of the conductive particles P is smaller than 30 μm, the sum of contact resistance among such conductive particles becomes considerably high because the number of contact points among the conductive particles in conductive paths formed in the conductive path-forming portions is increased, so that high conductivity cannot be achieved in the thickness-wise direction. If the number average particle diameter of the conductive particles P exceeds 150 μm on the other hand, variations in conductivity are easy to occur among the conductive path-forming portions, and the hardness of the conductive path-forming portions tends to be high because the number of such conductive particles contained in the conductive path-forming portions is reduced, so that stable electrical connection to electrodes intended to be connected cannot be achieved.

The water content in the conductive particles P is preferably at most 5%, more preferably at most 3%, still more preferably at most 2%, particularly preferably at most 1%. The use of the conductive particles satisfying such conditions can prevent or inhibit the occurrence of bubbles in the polymeric substance-forming material layer upon the curing treatment of the polymeric substance-forming material layer in the production process, which will be described subsequently.

The surfaces of the conductive particles P may be suitably treated with a coupling agent such as a silane coupling agent before use. By treating the surfaces of the conductive particles with the coupling agent, the adhesion property of the conductive particles P to the elastic polymeric substances is enhanced, so that the resulting conductive path-forming portions 35 become high in durability in repeated use.

The amount of the coupling agent used is suitably selected within limits not affecting the conductivity of the conductive particles P. However, it is preferably such an amount that a coating rate (proportion of an area coated with the coupling agent to the surface area of the conductive core particles) of the coupling agent on the surfaces of the conductive particles P amounts to at least 5%, more preferably 7 to 100%, still more preferably 10 to 100%, particularly preferably 20 to 100%.

Such conductive particles P are preferably contained in a proportion of 30 to 60%, more preferably 35 to 50% in terms of volume fraction in the conductive path-forming portions. If this proportion is lower than 30%, it may be impossible in some cased to obtain conductive part-forming portions sufficiently low in electric resistance value. If the proportion exceeds 60% on the other hand, the resulting conductive path-forming portions are liable to be brittle, so that elasticity required of the conductive path-forming portions may not be achieved in some cases.

The durometer hardness of the conductive path-forming portions 35 is 15 to 45, preferably 20 to 40. If the durometer hardness is lower than 15, it is difficult to retain a good electrically connected state because great permanent compression set is caused in the conductive path-forming portions 35 when the conductive path-forming portions 35 are held in a state pressed for a long period of time under a high-temperature environment. If the durometer hardness exceeds 45 on the other hand, conductive paths having low electric resistance are not formed in the conductive path-forming portions 35 because the conductive path-forming portions 35 are not sufficiently deformed under small pressing force. As a result, it is difficult to achieve a stable electrically connected state.

The term "durometer hardness" as used in the present invention is defined by hardness measured by means of a Type A durometer in accordance with the durometer hardness test prescribed in JIS K 6253.

An electric resistance between conductive path-forming portions 35 adjacent to each other is at least 10 MΩ, preferably at least 20 MΩ. If the electric resistance is lower than 10 MΩ, reliability on connection to electrodes intended to be connected becomes low.

The allowable current value of each of the conductive path-forming portions 35 when the conductive path-forming portion 35 is pressed in the thickness-wise direction thereof under a load of 40 g is preferably at least 3 A.

The allowable current value of each of the conductive path-forming portions 35 when the conductive path-forming portion 35 is pressed in the thickness-wise direction thereof so as to give a distortion factor of 10% is preferably at least 1 A.

The term "allowable current value of the conductive path-forming portion" is defined by a maximum current value that the electric resistance in the conductive path-forming portion does not exceed 0.1 Ω after a current is applied to the conductive path-forming portion for 20 seconds in a state that the conductive path-forming portion has been pressed in a thickness-wise direction under a room-temperature environment.

If the allowable current value is too small, the conductive path-forming portion 35 generates a heat when a current of a value necessary for electrical inspection is applied to the conductive path-forming portion 35 in the case where such an anisotropically conductive sheet is used in the inspection of, for example, a wafer, so that the anisotropically conductive sheet tends to cause some trouble in its early states to fail to achieve a long service life. Therefore, an operation for replacing the failed anisotropically conductive sheet by a new one must be frequently conducted, thus incurs the reduction of inspection efficiency.

In the anisotropically conductive sheet according to the present invention, an electric resistance (hereinafter also referred to as "electric resistance $R_a$") of each of the conductive path-forming portions in the thickness-wise direction as measured in a state that the conductive path-forming portion has been pressed under a load of 40 g in the thickness-wise direction is preferably at most 0.1 Ω, more preferably at most 0.08 Ω.

If this electric resistance $R_a$ exceeds 0.1 Ω, the conductive path-forming portion 35 generates a heat and tends to be damaged when a current of a value necessary for electrical inspection is applied to the conductive path-forming portion 35 in the case where such an anisotropically conductive sheet is used in the inspection of, for example, a wafer, so that the anisotropically conductive sheet fails to achieve a long service life. Therefore, an operation for replacing the failed anisotropically conductive sheet by a new one must be frequently conducted, thus incurs the reduction of inspection efficiency.

Further, an electric resistance (hereinafter also referred to as "electric resistance $R_b$") of each of the conductive path-forming portions in the thickness-wise direction thereof as measured in a state that the conductive path-forming portion has been pressed in the thickness-wise direction under a load of 40 g, after a cycle that the conductive path-forming portion is pressed for 15 minutes in the thickness-wise direction under a load of 40 g and then held for 5 minutes in an unloaded state, in an environment of 100° C. in temperature, was repeated for 3,000 times is preferably at most 0.1 Ω, more preferably at most 0.08 Ω.

If this electric resistance Rb exceeds 0.1 Ω, the conductive path-forming portion 35 generates a heat and tends to be damaged when a current of a value necessary for electrical inspection is applied to the conductive path-forming portion 35 in the case where such an anisotropically conductive sheet is used in the inspection of, for example, a wafer, so that the anisotropically conductive sheet fails to achieve a long service life. Therefore, an operation for replacing the failed anisotropically conductive sheet by a new one must be frequently conducted, thus incurs the reduction of inspection efficiency.

In addition, an electric resistance (hereinafter also referred to as "electric resistance $R_c$") of each of the conductive path-forming portions in the thickness-wise direction thereof as measured in a state that the conductive path-forming portion has been pressed in the thickness-wise direction so as to give a distortion factor of 10% is preferably at most 0.1 Ω, more preferably 0.08 Ω.

If this electric resistance $R_c$ exceeds 0.1 Ω, the conductive path-forming portion 35 generates a heat and tends to be damaged when a current of a value necessary for electrical inspection is applied to the conductive path-forming portion 35 in the case where such an anisotropically conductive sheet is used in the inspection of, for example, a wafer, so that the anisotropically conductive sheet fails to achieve a long service life. Therefore, an operation for replacing the failed anisotropically conductive sheet by a new one must be frequently conducted, thus incurs the reduction of inspection efficiency.

Further, an electric resistance (hereinafter also referred to as "electric resistance $R_d$") of each of the conductive path-forming portions in the thickness-wise direction thereof as measured after a current of 1 A is applied to the conductive path-forming portion for 3,000 hours in a state that the conductive path-forming portion had been pressed in the thickness-wise direction in an environment of 100° C. in temperature so as to give a distortion factor of 10% is preferably at most 0.1 Ω, more preferably at most 0.08 Ω.

If this electric resistance $R_d$ exceeds 0.1 Ω, the conductive path-forming portion 35 generates a heat and tends to be damaged when a current of a value necessary for electrical inspection is applied to the conductive path-forming portion 35 in the case where such an anisotropically conductive sheet is used in the inspection of, for example, a wafer, so that the anisotropically conductive sheet fails to achieve a long service life. Therefore, an operation for replacing the failed anisotropically conductive sheet by a new one must be frequently conducted, thus incurs the reduction of inspection efficiency.

A coefficient of variation of each of the electric resistances $R_a$, $R_b$, $R_c$ and $R_d$ as to all the conductive path-forming portions of the anisotropically conductive sheet is preferably at most 50%. If this coefficient of variation exceeds 50%, high reliability on connection may not be achieved in some cases in such an anisotropically conductive sheet because a variation in conductivity between the conductive path-forming portions becomes great.

The overall thickness (thickness of conductive path-forming portion 35 in the illustrated embodiment) of the elastic anisotropically conductive film 34 is preferably 0.3 to 3 mm, more preferably 0.4 to 2.5 mm. When this thickness is 0.3 mm or more, an elastic anisotropically conductive film 34 having sufficient strength is obtained with certainty. When this thickness is 3 mm or less on the other hand, conductive path-forming portions 35 having necessary conductivity are obtained with certainty.

The total projected height of projected portions 35A and 35B in each conductive path-forming portion 35 is preferably at least 20% of the thickness of such a conductive path-forming portion 35, more preferably at least 25%. Projected portions 35A and 35B having such a projected height are formed, whereby the conductive path-forming portions 35 are sufficiently compressed by small pressure, so that good conductivity is surely obtained.

Such an anisotropically conductive sheet 31 can be produced, for example, in the following manner.

An insulating sheet body 32, in which a through-hole 33 extending in a thickness-wise direction thereof, is first produced. As a method for forming the through-hole 33 in the insulating sheet body 32, may be used a physical processing method such as a method using cutting die, a punching processing method, drilling processing method, rooter processing method or laser machining method, or a chemical processing method such as a chemical etching method.

Figure 3:
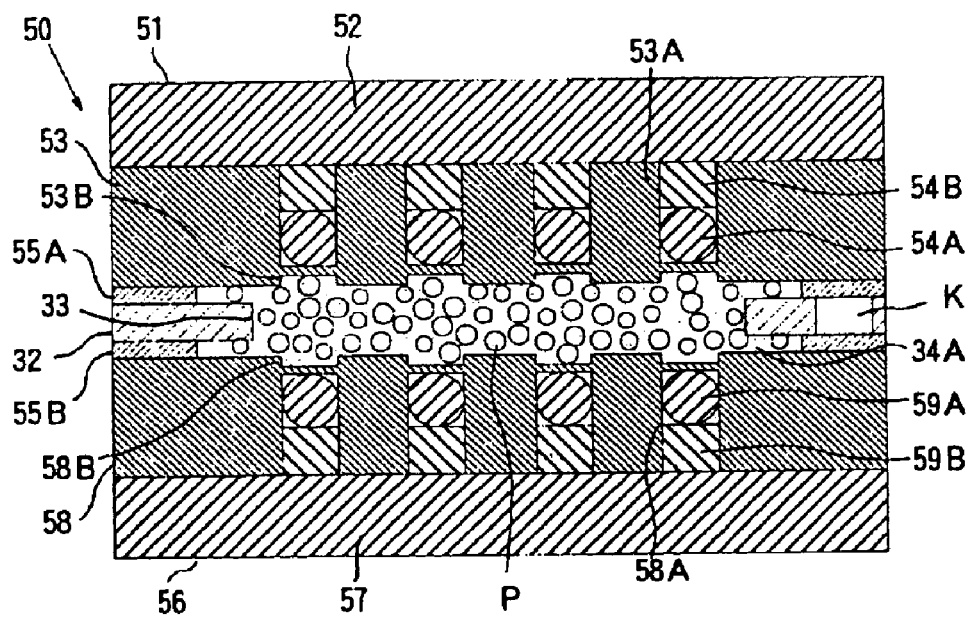
FIG. 3 is a cross-sectional view illustrating the construction of an exemplary mold for molding of an elastic anisotropically conductive film.
Figure 4:
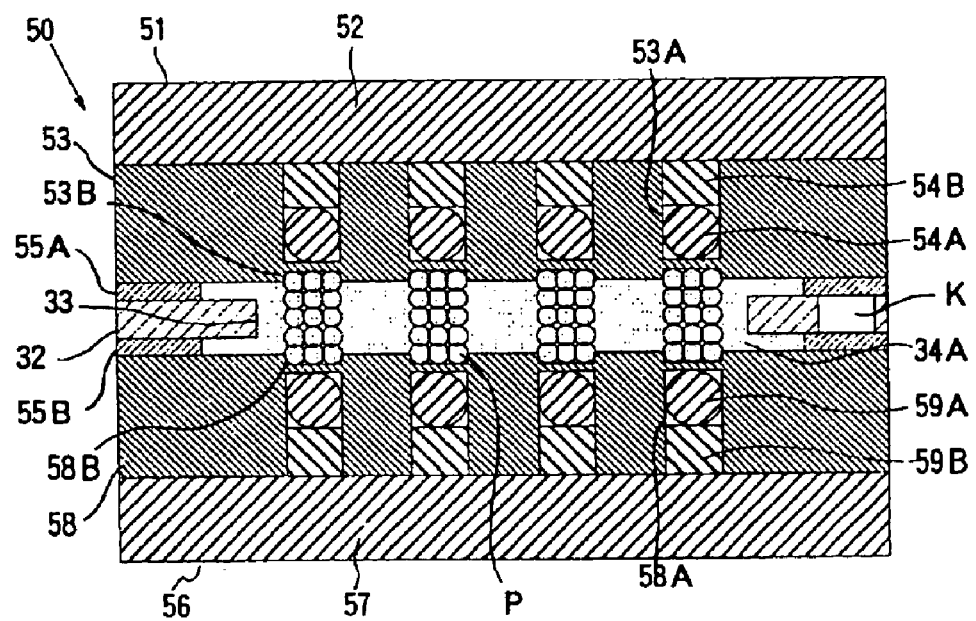
FIG. 4 is a cross-sectional view illustrating a state that a parallel magnetic field having intensity distribution has been applied to a molding material layer formed in the mold.

A flowable molding material in which conductive particles exhibiting magnetism are dispersed in a liquid polymeric substance-forming material, which will become an insulating elastic polymeric substance by a curing treatment, is then prepared. As illustrated in FIG. 3, a mold 50 for molding an elastic anisotropically conductive film is provided and the insulating sheet body 32 is arranged in alignment on an upper surface of a bottom force 56 of the mold 50 through a spacer 55B. A top force 51 is arranged in alignment on the insulating sheet body 32 through a spacer 55A, and the molding material prepared above is filled in a mold cavity formed by the top force 51, the bottom force 56, the spacers 55A and 55B and the insulating sheet body 32 to form a molding material layer 34A.

The mold 50 will now be described. In the top force 51, a non-magnetic base plate 53 is arranged by being fixed to a lower surface of a ferromagnetic base plate 52 by, for example, a screw mechanism (not illustrated). In an upper surface of the non-magnetic base plate 53, a great number of recesses 53A for receiving a magnetic member for receiving magnetic member 54A, which will be described subsequently, are formed in accordance with a pattern antipodal to an arrangement pattern of conductive path-forming portions 35 of an elastic anisotropically conductive film 34 to be formed, and in a lower surface of the non-magnetic base plate 53, recesses 53B for forming projected portions for forming projected portions 35A of the conductive path-forming portions 35 are formed in accordance with a pattern antipodal to an arrangement pattern of conductive path-forming portions 35 of the elastic anisotropically conductive film 34 to be formed. Within the recesses 53A for receiving magnetic member in the non-magnetic base plate 53, a spherical magnetic member 54A having a diameter conforming to a diameter of each recess 53A for receiving the magnetic member is received, and a columnar lid member 54B for fixing the magnetic member 54A within the recess 53A for receiving the magnetic member is provided so as to close the opening of each of the recesses 53A for receiving the magnetic member.

In the bottom force 56 on the other hand, a non-magnetic base plate 58 is arranged by being fixed to an upper surface of a ferromagnetic base plate 57 by, for example, a screw mechanism (not illustrated). In a lower surface of the non-magnetic base plate 58, a great number of recesses 58A for receiving a magnetic member for receiving magnetic member 59A are formed in accordance with the same pattern as an arrangement pattern of the conductive path-forming portions 35 of the elastic anisotropically conductive film 34 to be formed, and in an upper surface of the non-magnetic base plate 58, recesses 58B for forming projected portions for forming projected portions 35B of the conductive path-forming portions 35 are formed in accordance with the same pattern as an arrangement pattern of the conductive path-forming portions 35 of the elastic anisotropically conductive film 34 to be formed. Within the recesses 58A for receiving a magnetic member in the non-magnetic base plate 58, a spherical magnetic member 59A having a diameter conforming to a diameter of each recess 58A for receiving the magnetic member is received, and a columnar lid member 59B for fixing the magnetic member 59A within the recess 58A for receiving the magnetic member is provided so as to close the opening of each of the recesses 58A for receiving the magnetic member.

As a material for forming the ferromagnetic base plates 52 and 57 and the magnetic members 54A and 59A in both top force 51 and bottom force 56, may be used iron, nickel, cobalt, an alloy thereof, or the like.

As a material for forming the non-magnetic base plates 53 and 58 in both top force 51 and bottom force 56, may be used copper, a copper alloy such as brass, aluminum, an aluminum alloy such as duralmin, or the like.

As a material for forming the lid members 54B and 59B, may be used a ferromagnetic substance material. As specific examples thereof, may be mentioned iron, nickel, cobalt and alloys thereof.

Electromagnets or permanent magnets are then arranged on the upper surface of the ferromagnetic base plate 52 in the top force 51 and the lower surface of the ferromagnetic base plate 57 in the bottom force 56 to apply a parallel magnetic field having strength distribution, i.e., a parallel magnetic field having higher intensity at portions between the magnetic members 54A in the top force 51 and their corresponding magnetic members 59A in the bottom force 56 in the thickness-wise direction of the molding material layer 34A. As a result, in the molding material layer 34A, the conductive particles P dispersed in the molding material layer 34A are gathered at portions located between the magnetic members 54A in the top force 51 and their corresponding magnetic members 59A in the bottom force 56 and oriented so as to align in the thickness-wise direction.

In this state, the molding material layer 34A is subjected to a curing treatment, whereby the anisotropically conductive film 34 composed of the conductive path-forming portions 35 arranged between the magnetic members 54A in the top force 51 and their corresponding magnetic members 59A in the bottom force 56 and containing the conductive particles P at a high density, and the insulating portions 36 interposed between these conductive path-forming portions 35, in which the conductive particles P are not present at all or scarcely present is formed in the through-hole 33 in the insulating sheet body 32 in a state fixed and supported by an inner peripheral edge portion thereabout, thereby producing an anisotropically conductive sheet 31.

In the above-described production process, the intensity of the parallel magnetic field applied to the molding material layer 34A is preferably an intensity that it amounts to 0.02 to 2.0 T on the average between the magnetic members 54A in the top force 51 and their corresponding magnetic members 59A in the bottom force 56.

When the insulating sheet body 32 is formed by a material having a saturation magnetization of at least 0.1 wb/m$^2$, the magnetic field having the high intensity are also applied to portions located on the insulating sheet body 32 in the molding material forming layer 34A, so that there is a possibility that the conductive particles P may remain on such portions.

The curing treatment of the molding material layer 34A may be conducted in a state that the parallel magnetic field has been applied as it is, or may also be conducted after the application of the parallel magnetic field is stopped.

The curing treatment of the molding material layers 34A is suitably selected according to the material used. However, the treatment is generally conducted by a heat treatment. Specific heating temperature and heating time are suitably set in view of the kinds of the polymeric substance-forming material making up the molding material layer 34A, and the like, the time required for movement of the conductive particles P, and the like.

Figure 5:
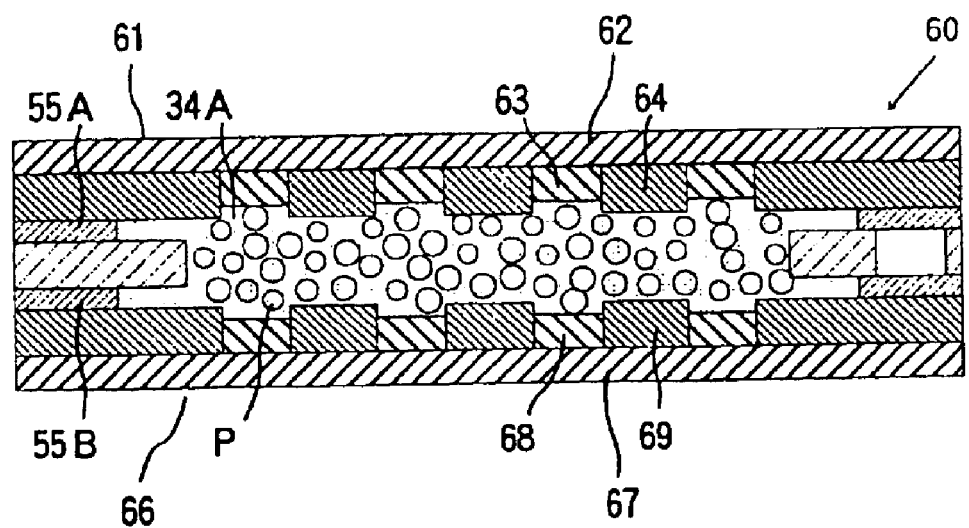
FIG. 5 is a cross-sectional view illustrating the construction of another exemplary mold for molding of an elastic anisotropically conductive film.

A mold 60 illustrated in FIG. 5 may be used as a mold for molding the elastic anisotropically conductive film 34 in place of the mold 50 illustrated in FIG. 3.

The mold 60 will be described specifically. The mold 60 is constructed by arranging a top force 61 and a bottom force 66 so as to be opposed to each other.

In the top force 61, ferromagnetic substance layers 63 are formed in accordance with a pattern antipodal to an arrangement pattern of conductive path-forming portions 35 of the intended anisotropically conductive sheet 31 on a lower surface of a ferromagnetic base plate 62, and non-magnetic substance layers 64 having a thickness greater than that of the ferromagnetic substance layers 63 are formed at other areas than the ferromagnetic substance layers 63.

In the bottom force 66 on the other hand, ferromagnetic substance layers 68 are formed in accordance with the same pattern as the arrangement pattern of the conductive path-forming portions 35 of the intended anisotropically conductive sheet 31 on an upper surface of a ferromagnetic base plate 67, and non-magnetic substance layers 69 having a thickness greater than that of the ferromagnetic substance layers 68 are formed at other areas than the ferromagnetic substance layers 68.

As a material for forming the ferromagnetic base plates 62 and 67 and the ferromagnetic substance layers 63 and 68 in both top force 61 and bottom force 66, may be used iron, nickel, cobalt, an alloy thereof, or the like.

As a material for forming the non-magnetic substance layers 64 and 69 in both top force 61 and bottom force 66, may be used a non-magnetic metal such as copper, a heat-resistant resin such as polyimide, a radiation-curable resin, or the like.

Figure 6:
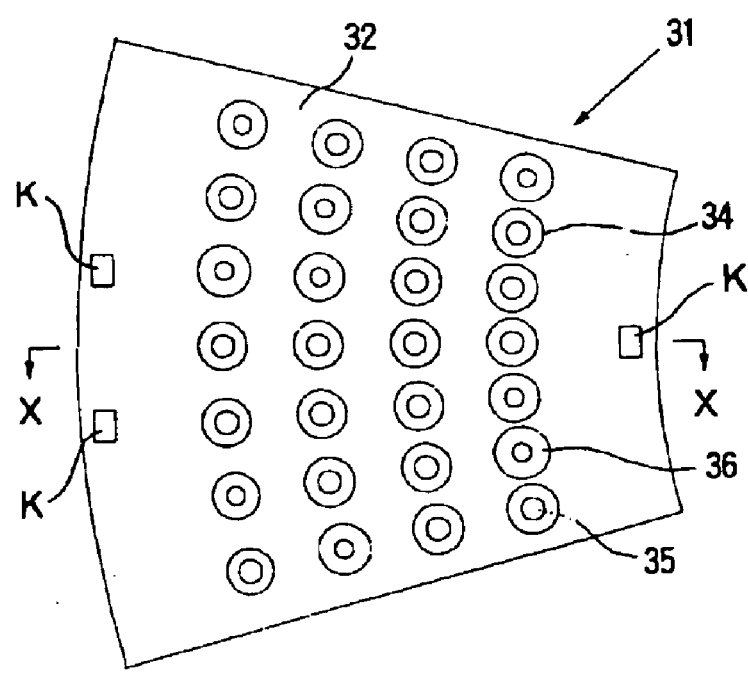
FIG. 6 is a plan view illustrating another exemplary anisotropically conductive sheet according to the present invention.
Figure 7:
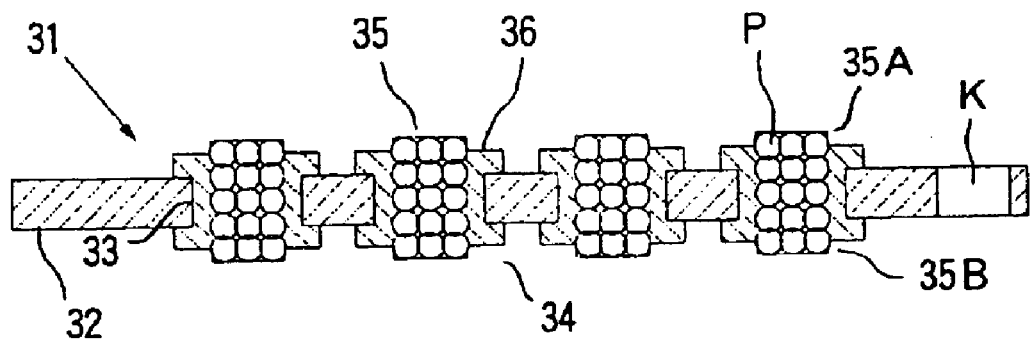
FIG. 7 is a cross-sectional view of the anisotropically conductive sheet taken along line X—X in FIG. 6.

FIG. 6 is a plan view illustrating another exemplary anisotropically conductive sheet according to the present invention, and FIG. 7 is a cross-sectional view of the anisotropically conductive sheet taken along line X—X in FIG. 6.

The anisotropically conductive sheet 31 is formed by an insulating sheet body 32 in the form of substantially a fan in a plane thereof, which has a plurality of through-holes 33 of circular shape in a section, each extending in a thickness-wise direction thereof, and a plurality of elastic anisotropically conductive films 34 arranged in the respective through-holes 33 in the insulating sheet body 32 and supported by inner peripheral edge portions about their corresponding through-holes 33. In the illustrated embodiment, a plurality of positioning holes K for positioning and arranging the anisotropically conductive sheet 31 are formed in peripheral edge portions of the insulating sheet body 32.

Each of the anisotropically conductive films 34 is formed by a conductive path-forming portion 35 extending in a thickness-wise direction of the film and an insulating portion 36 formed about the conductive path-forming portion 35. In the illustrated embodiment, projected portions 35A and 35B respectively protruding from both surfaces of the insulating portion 36 are formed at each of the conductive path-forming portions 35.

Each of the conductive path-forming portions 35 is formed by containing conductive particles P exhibiting magnetism at a high density in an insulating elastic polymeric substance in a state oriented in the thickness-wise direction, and the insulating portions 36 are formed by the insulating elastic polymeric substance.

In the anisotropically conductive sheet 31, an electric resistance between conductive path-forming portions 35 adjacent to each other of elastic anisotropically conductive films 34 is at least 10 MΩ, preferably at least 20 MΩ. If the electric resistance is lower than 10 MΩ, reliability on connection to electrodes intended to be connected becomes low. Other specific constructions are basically the same as those in the anisotropically conductive sheet 31 illustrated in FIGS. 1 and 2.

According to such anisotropically conductive sheets 31 as described above, they do not greatly deform when the peripheral edge portion of the insulating sheet body 31 is held because the anisotropically conductive sheets 31 has the insulating sheet body 32 whose modulus of elasticity falls within the specific value range, so that positioning operation of the anisotropically conductive sheet 31 to electrodes intended to be connected can be conducted with ease.

Since the insulating sheet body 32 is composed of the material having a low coefficient of linear thermal expansion, a good electrically connected state can be stably retained even in changes of temperature environment.

Since the specific conductive particles P are filled in the conductive path-forming portions 35 in the elastic anisotropically conductive film 34, and the durometer hardness of the conductive path-forming portions 35 falls within the specific range, high conductivity is achieved, and at the same time, an electrically connected state to electrodes intended to be connected is stably achieved.

Since the electric resistance between the conductive path-forming portions 35 is at least 10 MΩ, high reliability on connection to electrodes intended to be connected is achieved.

[Wafer Inspection Apparatus]

Figure 8:
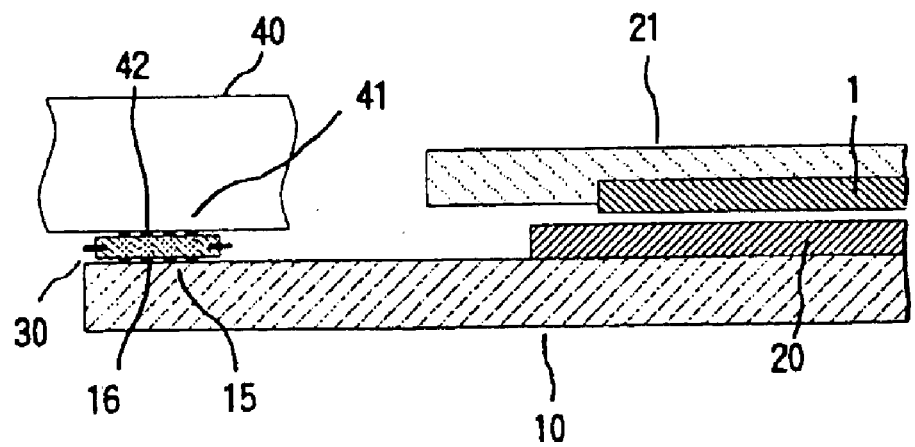
FIG. 8 is a cross-sectional view illustrating the construction of an exemplary wafer inspection apparatus according to the present invention.

FIG. 8 is a cross-sectional view illustrating the construction of an exemplary wafer inspection apparatus according to the present invention. The wafer inspection apparatus serves to conduct the WLBI test as to a wafer on which a great number of integrated circuits have been formed.

The wafer inspection apparatus illustrated in FIG. 8 has a controller 40 for performing temperature control of a wafer 1 for the purpose of conducting the inspection of the wafer 1 at a prescribed temperature, supplying an electric power for conducting the inspection of the wafer 1, making input-output control of signals and detecting output signals from the wafer 1 to judge the quality of integrated circuits on the wafer 1. The controller 40 has an input-output terminal part 41, in which a great number of input-output terminals 42 have been arranged in accordance with a proper pattern, on a lower surface thereof.

A disk-like circuit board 10 for inspection is provided below the controller 40. A leading terminal part 15, in which a great number of leading terminals 16 have been arranged in accordance with a pattern corresponding to a pattern of the input-output terminals 42 in the controller 40, is formed at a peripheral edge portion in one surface (upper surface in FIG. 8) of the circuit board 10 for inspection as also illustrated on an enlarged scale in FIG. 9. An inspection electrode part (not illustrated), in which a great number of inspection electrodes (not illustrated) electrically connected to the respective leading terminals 16 through a circuit in the circuit board 10 for inspection have been arranged, is formed at a central portion of said one surface of the circuit board 10 for inspection. The circuit board 10 for inspection is arranged in a state held by a proper holding member in such a manner that the respective leading terminals 16 are opposed to the input-output terminals 42 of the controller 40.

A pitch (inter-center distance) between the input-output terminals 42 in the controller 40, i.e., a pitch between the leading terminals 16 in the circuit board 10 for inspection is preferably 0.5 to 5 mm, more preferably 1 to 2 mm. The leading terminals 16 are formed at such a pitch, whereby necessary electrical connection of the input-output terminals 42 in the controller 40 to the leading terminals 16 in the circuit board 10 for inspection can be surely achieved, and moreover the leading terminals 16 can be arranged at a high density. Accordingly, a great number of leading terminals 16 according to number of electrodes to be inspected in the wafer 1 as an object of the inspection can be formed.

A contact member 20 having a great number of contactors (not illustrated) brought into contact with electrodes (not illustrated) to be inspected of the integrated circuits in the wafer 1 as the object of the inspection is arranged on the inspection electrode part in said one surface of the circuit board 10 for inspection, and the respective contactors of this contact member 20 are electrically connected to the respective inspection electrodes of the circuit board 10 for inspection.

No particular limitation is imposed on the specific construction of the contact member 20. For example, that in which contactors composed of blades or pins are arranged, that in which the contactor is composed of anisotropically conductive sheet, that composed of a sheet-like connector, in which contactors each composed of a metallic body extending through an insulating sheet in a thickness-wise direction thereof have been arranged, that obtained by laminating an anisotropically conductive sheet and a sheet-like connector, or the like may be adopted.

Figure 9:
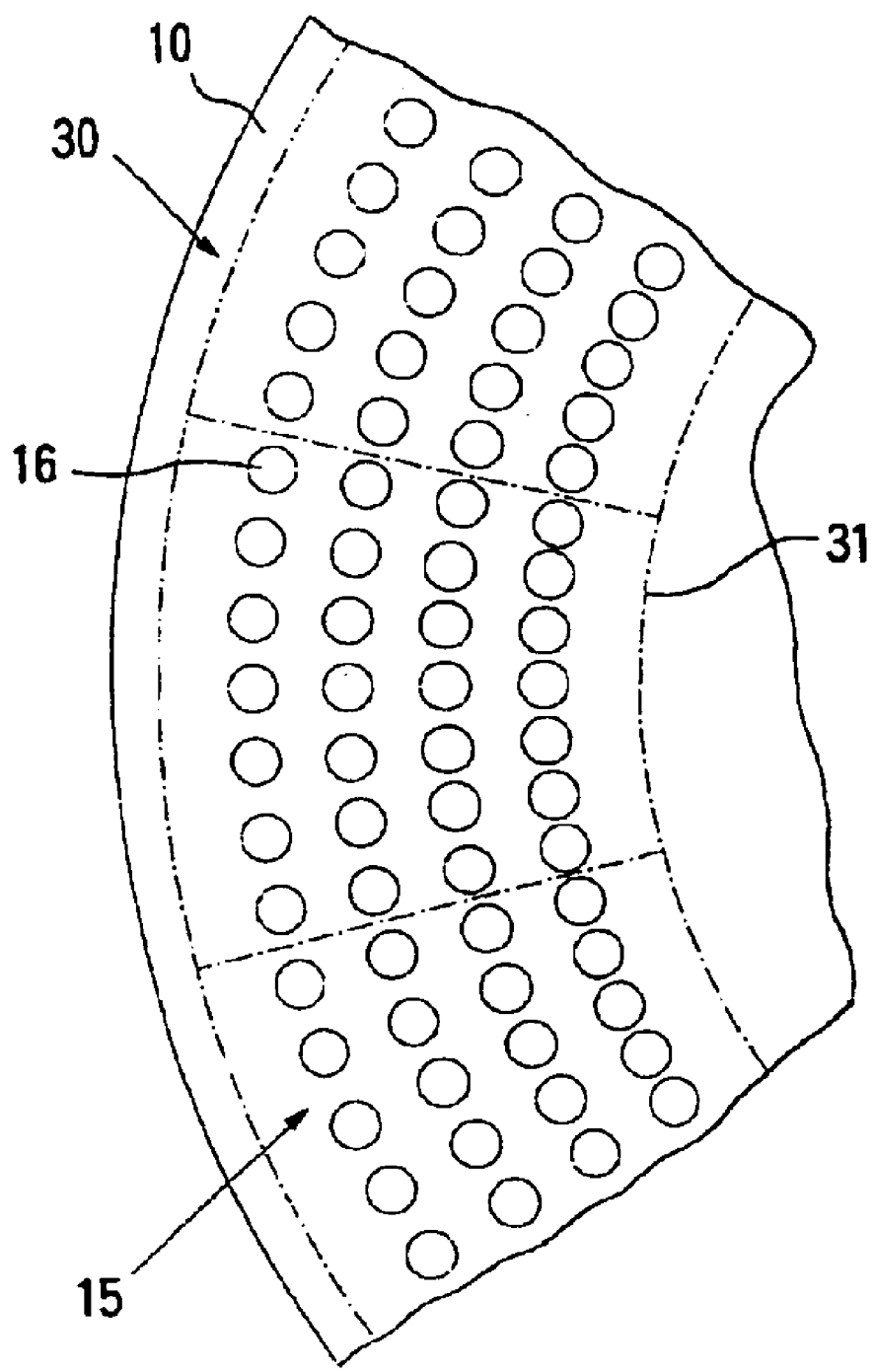
FIG. 9 illustrates, on an enlarged scale, a part of a leading terminal part in a circuit board for inspection.

A connector 30 composed of the anisotropically conductive sheets 31 illustrated in FIG. 1 is arranged between the leading terminal part 15 of the circuit board 10 for inspection and the input-output terminal part 41 of the controller 40. Specifically, the connector 30 is formed by arranging a plurality of the anisotropically conductive sheets 31 (shown by alternate long and short dash lines) in the form of substantially a fan in a plane so as to align along a circumferential direction on the surface of the leading terminal part 15 in the circuit board 10 for inspection as illustrated in FIG. 9. This connector 30 is held in a state pressed against the input-output terminal part 41 of the controller 40 by means of a proper pressing mechanism, whereby the leading terminals 16 of the circuit board 10 for inspection are electrically connected to the input-output terminals 42 of the controller 40. The pressing force applied to the connector 30 is 0.1 to 1 N (0.01 to 0.1 kgw) per an input-output terminal 42 of the controller 40.

In the wafer inspection apparatus described above, the wafer 1 as the object of the inspection is held by a wafer holder 21 combined with a heating plate above the contact member 20, and the wafer holder 21 is pressed downward by proper means, whereby the contactors of the contact member 20 are brought into contact with the respective electrodes to be inspected in the wafer 1, thereby achieving necessary electrical connection. After the wafer 1 is heated to a prescribed temperature by the wafer holder 21 and held for a long period of time in this state, necessary electrical inspection (burn-in test) as to the wafer 1 is performed.

According to such a wafer inspection apparatus, the connector 30 for electrically connecting the circuit board 10 for inspection to the controller 40 is constructed by the anisotropically conductive sheets 31, whereby the electrical connection of the leading terminals 16 of the circuit board 10 for inspection to the input-output terminals 42 of the controller 40 is surely achieved under small pressing force, so that there is no need of using a large-scaled mechanism as the pressing mechanism, and at the same time there is no need of using a large-scaled member as the holding member for the circuit board 10 for inspection. In addition, since a separated distance between the circuit board 10 for inspection and the controller 40 is short, the size of the wafer inspection apparatus in the height-wise direction can be made small. Accordingly, the wafer inspection apparatus can be miniaturized as a whole.

Since the pressing force applied to the leading terminals 16 of the circuit board 10 for inspection is small, the leading terminals 16 are not damaged, so that the circuit board 10 for inspection is prevented from shortening the service life thereof.

The leading terminals 16 of the circuit board 10 for inspection are electrically connected by the anisotropically conductive sheets 31, whereby the leading terminals 16 can be arranged at a high density. Accordingly, a great number of leading terminals 16 can be formed on the circuit board 10 for inspection, so that an inspection as to a great number of electrodes to be inspected can be collectively performed.

In the electrical connection by the anisotropically conductive sheets 31, contact resistance is low, and a stable connected state can be achieved, so that good electrical properties can be achieved.

Since the leading terminals 16 of the circuit board 10 for inspection and the input-output terminals 42 of the controller 40 are electrically connected through the anisotropically conductive sheets 31, a distance of a signal transmission system can be made short, so that the wafer inspection apparatus can be applied to electrical inspection as to high functional integrated circuits of which high-speed processing is required.

Since the connector 30 is constructed by arranging a plurality of the anisotropically conductive sheets 31 so as to align along the surface of the leading terminal part 15 of the circuit board 10 for inspection, positioning operation of the anisotropically conductive sheets 31 to the circuit board 10 for inspection becomes easy.

Each of the anisotropically conductive sheets 31 making up the connector 30 may be small in area. Since such anisotropically conductive sheets 31 can be easily produced at a high yield, a reduction of a production cost can be achieved. In addition, when some trouble is caused in an anisotropically conductive sheet 31, only the anisotropically conductive sheet 31 may be replaced by new one, and so there is no need of replacing the whole connector 30, so that a maintenance cost required is small. Accordingly, the inspection cost of wafers can be reduced.

Since the anisotropically conductive sheets 31 making up the connector 30 have the insulating sheet body 32 whose modulus of elasticity is the specific value, they do not greatly deform when the peripheral edge portion of the insulating sheet body 31 is held, so that positioning operation of the anisotropically conductive sheets 31 can be conducted with ease.

Since the insulating sheet body 32 in each of the anisotropically conductive sheets 31 is composed of the material having a low coefficient of linear thermal expansion, a good electrically connected state between the controller 40 and the circuit board 10 for inspection can be stably retained even in changes of temperature environment.

Since the specific conductive particles P are filled in the conductive path-forming portions 35 in the elastic anisotropically conductive film 34 in each of the anisotropically conductive sheets 31, and the durometer hardness of the conductive path-forming portions 35 falls within the specific range, high conductivity is achieved, and moreover a stable electrically connected state to the controller 40 and the circuit board 10 for inspection is achieved.

Since the electric resistance between the conductive path-forming portions 35 is at least 10 MΩ, high reliability on connection to the controller 40 and the circuit board 10 for inspection is achieved.

Figure 10:
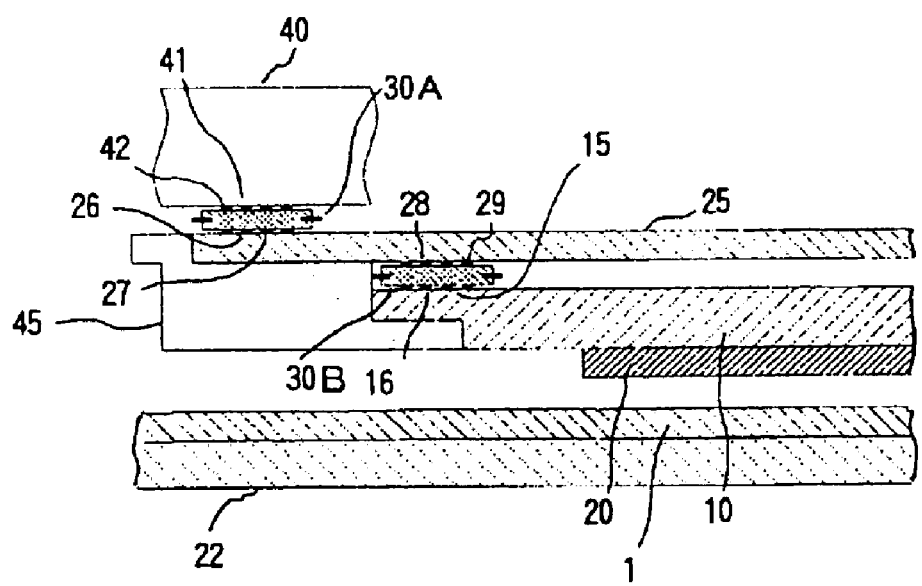
FIG. 10 is a cross-sectional view illustrating the construction of another exemplary wafer inspection apparatus according to the present invention.

FIG. 10 is a cross-sectional view illustrating the construction of another exemplary wafer inspection apparatus according to the present invention. This wafer inspection apparatus serves to conduct the probe test as to each of a great number of integrated circuits formed on a wafer.

A circuit board 10 for inspection in this wafer inspection apparatus has a leading terminal part 15, in which a great number of leading terminals 16 have been arranged correspondingly to input-output terminals 42 in a controller 40, on one surface (upper surface in FIG. 10) and an inspection electrode part (not illustrated), in which a great number of inspection electrodes (not illustrated) electrically connected to the respective leading terminals 16 by a circuit in the circuit board 10 for inspection have been arranged, on the other surface, and is held by a holding member 45.

On the inspection electrode part in the other surface of the circuit board 10 for inspection, is arranged a contact member 20 having a great number of contactors (not illustrated) brought into contact with electrodes (not illustrated) to be inspected of integrated circuits on a wafer 1 as an object of the inspection. The respective contactors of this contact member 20 are electrically connected to the respective inspection electrodes of the circuit board 10 for inspection.

A wafer tray 22 combined with a heating plate, on which the wafer 1 as the object of the inspection is mounted, is arranged under the contact member 20.

A pitch (inter-center distance) between the input-output terminals 42 in the controller 40, i.e., a pitch between one-side connecting electrodes 27 in the circuit board 25 for connection is preferably 1 to 5 mm, more preferably 2 to 3 mm.

A pitch (inter-center distance) between other-side connecting electrodes 29 in the circuit board 25 for connection, i.e., a pitch between the leading terminals 16 in the circuit board 10 for inspection is preferably 0.5 to 3 mm, more preferably 1 to 2 mm. The leading terminals 16 are formed at such a pitch, whereby necessary electrical connection of the other-side connecting electrodes 29 in the circuit board 25 for connection to the leading terminals 16 in the circuit board 10 for inspection can be surely achieved, and moreover the leading terminals 16 can be arranged at a high density. Accordingly, a great number of leading terminals 16 according to the number of electrodes to be inspected in the wafer 1 as an object of the inspection can be formed.

The circuit board 25 for connection is provided between the controller 40 and the circuit board 10 for inspection. The circuit board 25 for connection has one-side connecting electrode part 26, in which a great number of the one-side connecting electrodes 27 have been arranged in accordance with a pattern corresponding to a pattern of the input-output terminals 42 in the controller 40, on one surface (upper surface in FIG. 10) and the other-side connecting electrode part 28, in which a great number of the other-side connecting electrodes 29 have been arranged in accordance with a pattern corresponding to a pattern of the leading terminals 16 in the circuit board 10 for inspection, on the other surface. The circuit board 25 for connection is arranged in a state held by a holding member 45 in such a manner that the each of the one-side connecting electrodes 27 are opposed to the respective input-output terminals 42 in the controller 40, and the each of the other-side connecting electrodes 29 are opposed to the respective leading terminals 16 of the circuit board 10 for inspection.

A first connector 30A composed of the anisotropically conductive sheets 31 illustrated in FIG. 1 is arranged between the input-output terminal part 41 of the controller 40 and the one-side connecting electrode part 26 of the circuit board 25 for connection. Specifically, the first connector 30A is formed by arranging a plurality of the anisotropically conductive sheets 31 in the form of substantially a fan in a plane so as to align along a circumferential direction on the surface of the one-side connecting electrode part 26 in the circuit board 25 for connection. The first connector 30A is held in a state pressed against the input-output terminal part 41 of the controller 40 by means of a proper pressing mechanism, whereby the one-side connecting electrodes 27 of the circuit board 25 for connection are electrically connected to the input-output terminals 42 of the controller 40.

A second connector 30B composed of the anisotropically conductive sheets 31 illustrated in FIG. 1 is arranged between the leading terminal part 15 of the circuit board 10 for inspection and the other-side connecting electrode part 28 of the circuit board 25 for connection. Specifically, the second connector 30B is formed by arranging a plurality of the anisotropically conductive sheets 31 in the form of substantially a fan in a plane so as to align along a circumferential direction on the surface of the leading terminal part 15 in the circuit board 10 for inspection. The second connector 30B is held in a state pressed against the other-side connecting electrodes 29 of the circuit board 25 for connection by means of a proper pressing mechanism, whereby the other-side connecting electrodes 29 of the circuit board 25 for connection are electrically connected to the leading terminals 16 of the circuit board 10 for inspection.

In the above-described apparatus, the pressing force applied to the first and second connectors 30A and 30B is 0.1 to 1 N (0.01 to 0.1 kgw) per an input-output terminal 42 of the controller 40 or per the other-side connecting electrode 29 of the circuit board 25 for connection.

In the wafer inspection apparatus shown in FIG. 10, the wafer 1 as the object of the inspection is mounted on a wafer tray 22, and the wafer tray 22 is moved upward by proper means, whereby the contactors of the contact member 20 are brought into contact with the respective electrodes to be inspected in the wafer 1, thereby achieving necessary electrical connection. The wafer 1 is heated to a prescribed temperature by the wafer tray 22, and in this state, necessary electrical inspection (probe test) as to the wafer 1 is performed.

According to such a wafer inspection apparatus, the first connector 30A for electrically connecting the controller 40 and the circuit board 25 for connection is constructed by the anisotropically conductive sheets 31, and the second connector 30B for electrically connecting the circuit board 25 for connection and the circuit board 10 for inspection is constructed by the anisotropically conductive sheets 31, whereby the electrical connection of the input-output terminals 42 of the controller 40 and the one-side connecting electrodes 27 of the circuit board 25 for connection, and the electrical connection of the other-side connecting electrodes 29 of the circuit board 25 for connection and the leading terminals 16 of the circuit board 10 for inspection are surely achieved under small pressing force, so that there is no need of using a large-scaled mechanism as the pressing mechanism, and at the same time there is no need of using a large-scaled member as the holding member 45 for the circuit board 25 for connection and the circuit board 10 for inspection. In addition, since a separated distance between the controller 40 and the circuit board 25 for connection and a separated distance between the circuit board 25 for connection and the circuit board 10 for inspection are short, the size of the wafer inspection apparatus in the height-wise direction can be made small. Accordingly, the wafer inspection apparatus can be miniaturized as a whole.

Since the pressing force applied to the one-side connecting electrodes 27 of the circuit board 25 for connection and the leading terminals 16 of the circuit board 10 for inspection is small, the one-side connecting electrodes 27 and the leading terminals 16 are not damaged, so that the circuit board 25 for connection and the circuit board 10 for inspection are prevented from shortening the service life thereof.

Since the leading terminals 16 of the circuit board 10 for inspection are electrically connected by the anisotropically conductive sheets 31, the leading terminals 16 can be arranged at a high density. Accordingly, a great number of leading terminals 16 can be formed on the circuit board 10 for inspection, so that an inspection as to a great number of electrodes to be inspected can be collectively performed.

In the electrical connection by the anisotropically conductive sheets 31, contact resistance is low, and a stable connected state can be achieved, so that good electrical properties can be achieved.

Since the input-output terminals 42 of the controller 40 are electrically connected to the one-side connecting electrodes 27 of the circuit board 25 for connection through the anisotropically conductive sheets 31, and the other-side connecting electrodes 29 of the circuit board 25 for connection are electrically connected to the leading terminals 16 of the circuit board 10 for inspection through the anisotropically conductive sheets 31, a distance of a signal transmission system can be made short, so that the wafer inspection apparatus can be applied to electrical inspection as to high functional integrated circuits of which high-speed processing is required.

Since the first connector 30A is constructed by arranging a plurality of the anisotropically conductive sheets 31 so as to align along the surface of the one-side connecting electrode part 26 of the circuit board 25 for connection, and the second connector 30B is constructed by arranging a plurality of the anisotropically conductive sheets 31 so as to align along the surface of the leading terminal part 15 of the circuit board 10 for inspection, positioning operation of the anisotropically conductive sheets 31 to the circuit board 25 for connection and the circuit board 10 for inspection becomes easy.

Each of the anisotropically conductive sheets 31 making up the first and second connectors 30A and 30B may be small in area. Since such anisotropically conductive sheets 31 can be easily produced at a high yield, a reduction of a production cost can be achieved. In addition, when some trouble is caused in an anisotropically conductive sheet 31, only the anisotropically conductive sheet 31 may be replaced by new one, and so there is no need of replacing the whole first connector 30A or the whole second connector 30B, so that a maintenance cost required is small. Accordingly, the inspection cost of wafers can be reduced.

Since the anisotropically conductive sheets 31 making up the first and second connectors 30A and 30B have the insulating sheet body 32 whose modulus of elasticity is the specific value, they do not greatly deform when the peripheral edge portion of the insulating sheet body 32 is held, so that positioning operation of the anisotropically conductive sheets 31 can be conducted with ease.

Since the insulating sheet body 32 in each of the anisotropically conductive sheets 31 is composed of the material having a low coefficient of linear thermal expansion, a good electrically connected state between the controller 40 and the circuit board 25 for connection can be stably retained even in changes of temperature environment, and at the same time a good electrically connected state between the circuit board 25 for connection and the circuit board 10 for inspection can be stably retained.

Since the specific conductive particles P are filled in the conductive path-forming portions 35 in the elastic anisotropically conductive film 34 in each of the anisotropically conductive sheets 31, and the durometer hardness of the conductive path-forming portions 35 falls within the specific range, high conductivity is achieved, and moreover a stable electrically connected state to the controller 40, the circuit board 25 for connection and the circuit board 10 for inspection is achieved.

Since the electric resistance between the conductive path-forming portions 35 is at least 10 MΩ, high reliability on connection to the controller 40, circuit board 25 for connection and the circuit board 10 for inspection is achieved.

The wafer inspection apparatus according to the present invention are not limited to the embodiments described above, and various modifications can be added thereto.

For example, in the wafer inspection apparatus illustrated in FIG. 8, the apparatus may be constructed by forming inspection electrodes on the other surface (lower surface in FIG. 8) of the circuit board 10 for inspection, arranging the contact member 20 on the other surface of the circuit board 10 for inspection and providing a wafer tray, on which the wafer 1 as the object of the inspection is mounted, below the contact member 20.

In the wafer inspection apparatus illustrated in FIG. 10, the apparatus may be constructed by forming one of the first and second connectors 30A and 30B by the anisotropically conductive sheets 31 and the other by arranging a connecting pins.

The present invention will hereinafter be described specifically by the following examples. However, the present invention is not limited to these examples.

[Production Example 1 of Mold]

A brass plate having a thickness of 3.0 mm was provided, a plurality of recesses for receiving a magnetic member, which each had a circular section whose diameter was 1.0 mm and depth was 2.7 mm, were formed in one surface of such a non-magnetic base plate by a drilling machine at a pitch of 2 mm in an X—X direction (the direction meaning a direction corresponding to the X—X direction in FIG. 1 or FIG. 6; the same shall apply hereinafter), and a plurality of recesses for forming a projected portion, which each had a circular section whose diameter was 0.8 mm and depth was 0.2 mm, were formed in the other surface of the non-magnetic base plate at a pitch of 2 mm in the X—X direction, thereby producing a non-magnetic base plate. A spherical magnetic member made of iron having a diameter of 1.0 mm was arranged in each of the recesses for receiving the magnetic member in this non-magnetic base plate, and a columnar lid member having a thickness of 1.7 mm and a diameter of 1.0 mm was arranged so as to close the opening of the each of the recesses for receiving the magnetic member.

This non-magnetic base plate was arranged on a ferromagnetic base plate made of iron having a thickness of 6 mm and fixed by a screw mechanism, thereby making a top force. A bottom force was made in the same manner as in the production of the top force to produce a mold of the construction shown in FIG. 3. This mold is referred to as "Mold a".

[Production Example 2 of Mold]

An iron plate having a thickness of 6 mm was provided, and one surface of this iron plate was subjected to a photoetching treatment using a dry film resist and ferric chloride, thereby producing an intermediate in which a plurality of disk-like ferromagnetic substance layers each having a thickness of 0.1 mm and a diameter of 0.5 mm had been integrally formed at a pitch of 1.27 mm in the X—X direction in a ferromagnetic base plate made of iron having a thickness of 5.9 mm.

Non-magnetic substance layer having a thickness of 0.2 mm was formed at other area than the ferromagnetic substance layers in said one surface of the intermediate by using a resist, thereby making a top force. A bottom force was made in the same manner as in the production of the top force to produce a mold of the construction shown in FIG. 5. This mold is referred to as "Mold b".

EXAMPLE 1

An insulating sheet body composed of a glass fiber-reinforced epoxy resin (modulus of elasticity: $2\times10^9$ Pa; coefficient of linear thermal expansion: $1.5\times10^{-5}$ $K^{-1}$; saturation magnetization: 0 wb/m$^2$) and having a thickness of 0.4 mm, in which a great number of through-holes each having a circular section of 1.8 mm in a diameter had been formed at a pitch of 2.0 mm in the X—X direction, was produced, and 2 spacers composed of stainless steel (SUS-304) having a thickness of 0.6 mm, in which a great number of through-holes each having a circular section of 1.95 mm in a diameter had been formed at a pitch of 2.0 mm in the X—X direction, were produced.

On the other hand, 6 g of conductive particles having a number average particle diameter of 120 $\mu$m were added to and mixed with 16 g of addition type liquid silicone rubber, "KE-2000-30" (product of Shin-Etsu Chemical Co., Ltd.), thereby preparing a molding material for molding an elastic anisotropically conductive film. As the conductive particles were used those obtained by forming a coating layer formed of gold and having a thickness of 125 nm on surfaces of core particles formed of nickel.

The insulating sheet body was arranged in alignment on an upper surface of the bottom force in Mold a through the spacer, the top force was arranged in alignment on the insulating sheet body through the spacer, and the molding material prepared above was filled in a mold cavity formed by the top force, the bottom force, the two spacers and the insulating sheet body to form a molding material layer.

Electromagnets were then arranged on the upper surface of the ferromagnetic base plate in the top force and the lower surface of the ferromagnetic base plate in the bottom force, and the electromagnets were operated, whereby applying a parallel magnetic field of 1 tesla between the magnetic members of the top force and their corresponding magnetic members of the bottom force, and at the same time a curing treatment was conducted under conditions of 100° C. and 1.5 hours to the molding material layer thereby forming an elastic anisotropically conductive film, in each of the through-holes in the insulating sheet body to produce an anisotropically conductive sheet.

EXAMPLE 2

An insulating sheet body composed of a polyimide resin (modulus of elasticity: $6\times10^9$ Pa; coefficient of linear thermal expansion: $1.0\times10^{-5}$ $K^{-1}$; saturation magnetization: 0 wb/m$^2$) and having a thickness of 0.2 mm, in which a great number of through-holes each having a circular section of 1.0 mm in a diameter had been formed at a pitch of 1.27 mm in the X—X direction, was produced, and 2 spacers composed of phosphor bronze having a thickness of 0.1 mm, in which a great number of through-holes each having a circular section of 1.2 mm in a diameter had been formed at a pitch of 1.27 mm in the X—X direction, were produced.

On the other hand, 8.8 g of conductive particles having a number average particle diameter of 40 $\mu$m were added to and mixed with 16 g of addition type liquid silicone rubber, "KE-2000-20" (product of Shin-Etsu Chemical Co., Ltd.), thereby preparing a molding material for molding an elastic anisotropically conductive film. As the conductive particles were used those obtained by forming a coating layer formed of gold and having a thickness of 84 nm on surfaces of core particles formed of nickel.

The insulating sheet body was arranged in alignment on an upper surface of the bottom force in Mold b through the spacer, the top force was arranged in alignment on the insulating sheet body through the spacer, and the molding material prepared above was filled in a mold cavity formed by the top force, the bottom force, the two spacers and the insulating sheet body to form a molding material layer.

Electromagnets were then arranged on the upper surface of the ferromagnetic base plate in the top force and the lower surface of the ferromagnetic base plate in the bottom force, and the electromagnets were operated, whereby applying a parallel magnetic field of 1 tesla between the magnetic members of the top force and their corresponding magnetic members of the bottom force, and at the same time a curing treatment was conducted under conditions of 100° C. and 1.5 hours to the molding material layer, thereby forming an elastic anisotropically conductive film in each of the through-holes in the insulating sheet body to produce an anisotropically conductive sheet.

EXAMPLE 3

An insulating sheet body composed of a polyimide resin (modulus of elasticity: $6 \times 10^9$ Pa; coefficient of linear thermal expansion: $1.0 \times 10^{-5}$ $K^{-1}$; saturation magnetization: 0 wb/m$^2$) and having a thickness of 0.2 mm, in which a through-hole having a rectangular section of 35 mm×12 mm had been formed, was produced, and 2 spacers composed of phosphor bronze having a thickness of 0.1 mm, in which a through-hole having a rectangular section of 35.5 mm×13.0 mm had been formed, were produced.

One the other hand, 11.6 g of conductive particles having a number average particle diameter of 60 μm were added to and mixed with 16 g of addition type liquid silicone rubber, "KE-2000-20" (product of Shin-Etsu Chemical Co., Ltd.), thereby preparing a molding material for molding an elastic anisotropically conductive film. As the conductive particles were used those obtained by forming a coating layer formed of gold and having a thickness of 75 nm on surfaces of core particles formed of nickel.

The insulating sheet body was arranged in alignment on an upper surface of the bottom force in Mold b through the spacer, the top force was arranged in alignment on the insulating sheet body through the spacer, and the molding material prepared above was filled in a mold cavity formed by the top force, the bottom force, the two spacers and the insulating sheet body to form a molding material layer.

Electromagnets were then arranged on the upper surface of the ferromagnetic base plate in the top force and the lower surface of the ferromagnetic base plate in the bottom force, and the electromagnets were operated, whereby applying a parallel magnetic field of 1 tesla between the magnetic members of the top force and their corresponding magnetic members of the bottom force, and at the same time a curing treatment was conducted under conditions of 100° C. and 1.5 hours to the molding material layer, thereby forming an elastic anisotropically conductive film in the each of the through-holes in the insulating sheet body to produce an anisotropically conductive sheet.

COMPARATIVE EXAMPLE 1

A sheet body composed of covar (modulus of elasticity: $1.5 \times 10^{11}$ Pa; coefficient of linear thermal expansion: $5 \times 10^{-6}$ $K^{-1}$; saturation magnetization: 1.4 wb/m$^2$) and having a thickness of 0.1 mm, in which a great number of through-holes each having a circular section of 1.0 mm in a diameter had been formed at a pitch of 1.27 mm in the X—X direction, was produced, and 2 spacers composed of phosphor bronze having a thickness of 0.15 mm, in which a great number of through-holes each having a circular section of 1.2 mm in a diameter had been formed at a pitch of 1.27 mm in the X—X direction, were produced.

An anisotropically conductive sheet was produced in the same manner as in Example 2 except that the above-described sheet body and spacers were used.

COMPARATIVE EXAMPLE 2

Six grams of conductive particles having a number average particle diameter of 10 μm were added to and mixed with 16 g of addition type liquid silicone rubber, "KE-2000-30" (product of Shin-Etsu Chemical Co., Ltd.), thereby preparing a molding material for molding an elastic anisotropically conductive film. As the conductive particles were used those obtained by forming a coating layer formed of gold and having a thickness of 10 nm on surfaces of core particles formed of nickel.

An anisotropically conductive sheet was produced in the same manner as in Example 1 except that the above-prepared molding material was used.

COMPARATIVE EXAMPLE 3

Six grams of conductive particles having a number average particle diameter of 200 μm were added to and mixed with 16 g of addition type liquid silicone rubber, "KE-2000-30" (product of Shin-Etsu Chemical Co., Ltd.), thereby preparing a molding material for molding an elastic anisotropically conductive film. As the conductive particles were used those obtained by forming a coating layer formed of gold and having a thickness of 15 nm on surfaces of core particles formed of nickel.

An anisotropically conductive sheet was produced in the same manner as in Example 1 except that the above-prepared molding material was used.

COMPARATIVE EXAMPLE 4

Six grams of conductive particles having a number average particle diameter of 120 μm were added to and mixed with 16 g of addition type liquid silicone rubber, "KE-2000-60" (product of Shin-Etsu Chemical Co., Ltd.), thereby preparing a molding material for molding an elastic anisotropically conductive film. As the conductive particles were used those obtained by forming a coating layer formed of gold and having a thickness of 125 nm on surfaces of core particles formed of nickel.

An anisotropically conductive sheet was produced in the same manner as in Example 1 except that the above-prepared molding material was used.

COMPARATIVE EXAMPLE 5

To and with 16 g of addition type liquid silicone rubber, "KE-1950-10" (product of Shin-Etsu Chemical Co., Ltd.), were added and mixed 8.8 g of conductive particles having a number average particle diameter of 40 μm, thereby preparing a molding material for molding an elastic anisotropically conductive film. As the conductive particles were used those obtained by forming a coating layer formed of gold and having a thickness of 84 nm on surfaces of core particles formed of nickel.

An anisotropically conductive sheet was produced in the same manner as in Example 2 except that the above-prepared molding material was used.

Dimensions of the respective parts, proportions of the conductive particles in the conductive path-forming portions and durometer hardness of the conductive path-forming portions in the anisotropically conductive sheets according to Examples 1 to 3 and Comparative Examples 1 to 5 are shown in Table 1.

TABLE 1

|  |  |  | Example 1 | Example 2 | Example 3 | Comparative Example 1 | Comparative Example 2 | Comparative Example 3 | Comparative Example 4 | Comparative Example 5 |
|---|---|---|---|---|---|---|---|---|---|---|
| Insulating sheet body | | Thickness (mm) | 0.4 | 0.2 | 0.2 | 0.2 | 0.4 | 0.4 | 0.4 | 0.2 |
| | Through-hole | Number | plural | plural | 1 | plural | plural | plural | plural | plural |
| | | Shape | circular | circular | rectangular | circular | circular | circular | circular | circular |
| | | Diameter or width (mm) | 1.8 | 1.0 | 35 × 12.5 | 1.0 | 1.8 | 1.8 | 1.8 | 1.0 |
| | Property of material | Modulus of elasticity (Pa) | $2 \times 10^9$ | $6 \times 10^9$ | $6 \times 10^9$ | $1.5 \times 10^{11}$ | $2 \times 10^9$ | $2 \times 10^9$ | $2 \times 10^9$ | $6 \times 10^9$ |
| | | Coefficient of linear thermal expansion ($K^{-1}$) | $1.5 \times 10^{-5}$ | $1.0 \times 10^{-5}$ | $1.0 \times 10^{-5}$ | $5 \times 10^{-6}$ | $1.5 \times 10^{-5}$ | $1.5 \times 10^{-5}$ | $1.5 \times 10^{-5}$ | $1.0 \times 10^{-5}$ |
| | | Saturation magnetization (wb/m$^2$) | 0 | 0 | 0 | 1.4 | 0 | 0 | 0 | 0 |
| Elastic anisotropically conductive film | Conductive path-forming portion | Diameter (mm) | 0.8 | 0.5 | 0.5 | 0.5 | 0.8 | 0.8 | 0.8 | 0.5 |
| | | Thickness (mm) | 2.0 | 0.6 | 0.6 | 0.6 | 2.0 | 2.0 | 2.0 | 0.6 |
| | | Protruding height (mm) | 0.2 | 0.1 | 0.1 | 0.1 | 0.2 | 0.2 | 0.2 | 0.1 |
| | | Pitch in X—X direction (mm) | 2.0 | 1.27 | 1.27 | 1.27 | 2.0 | 2.0 | 2.0 | 1.27 |
| | | Conductive particle Number average particle diameter ($\mu$m) | 120 | 40 | 60 | 40 | 10 | 200 | 120 | 40 |
| | | Coating layer Thickness (nm) | 125 | 84 | 75 | 84 | 4.7 | 15 | 125 | 84 |
| | | Coating rate (mass %) | 8 | 15 | 10 | 15 | 4 | 0.1 | 8 | 15 |
| | | Proportion contained (volume %) | 25 | 30 | 35 | 30 | 25 | 25 | 30 | 30 |
| | | Durometer hardness | 33 | 24 | 25 | 25 | 32 | 34 | 62 | 13 |
| | Thickness of insulating portion (mm) | | 1.6 | 0.4 | 0.4 | 0.4 | 1.6 | 1.6 | 1.6 | 0.4 |

[Evaluation of Anisotropically Conductive Sheet]

The following Test 1 and Test 2 were performed on the anisotropically conductive sheets according to Examples 1 to 3 and Comparative Examples 1 to 5, and the following Test 3 and Test 4 were performed on the anisotropically conductive sheets according to Examples 1 to 3 and Comparative Example 5.

Test 1:

One electrode plate for test having a plurality of patterned electrodes formed in accordance with the same pattern as a pattern of the conductive path-forming portions of an anisotropically conductive sheet sample on one surface and the other electrode plate for test having a plurality of patterned electrodes formed in accordance with a pattern antipodal to a pattern of the conductive path-forming portions of the anisotropically conductive sheet on one surface were provided. The anisotropically conductive sheet was arranged on said one electrode plate for test in a state positioned in such a manner that the each of the conductive path-forming portions thereof are located on the patterned electrodes of the one electrode plate for test, and the other electrode plate was arranged in alignment on the anisotropically conductive sheet so as to locate the each of the patterned electrodes thereof on the conductive path-forming portions of the anisotropically conductive sheet.

The anisotropically conductive sheet was then pressed in a thickness-wise direction thereof by the other electrode plate for test under an environment of 100° C. so as to give a load of 40 g per a conductive path-forming portion. After the anisotropically conductive sheet was held for 15 minutes in this state, an electric resistance (hereinafter referred to as "conduction resistance") of each of the conductive path-forming portions in the thickness-wise direction and an electric resistance (hereinafter referred to as "insulation resistance") between adjacent conductive path-forming portions were measured. After completion of the measurement of these electric resistances, the pressing of the anisotropically conductive sheet by the other electrode plate for test was released, and the anisotropically conductive sheet was held for 5 minutes in this state. This process was regarded as a cycle, and the cycle was repeated 3,000 times in total.

The average value, maximum value and minimum value of the conduction resistance, and the minimum value of the insulation resistance in the first cycle, and the average value, maximum value and minimum value of the conduction resistance, and the minimum value of the insulation resistance in the three thousandth cycle are shown in Table 2.

Figure 11:
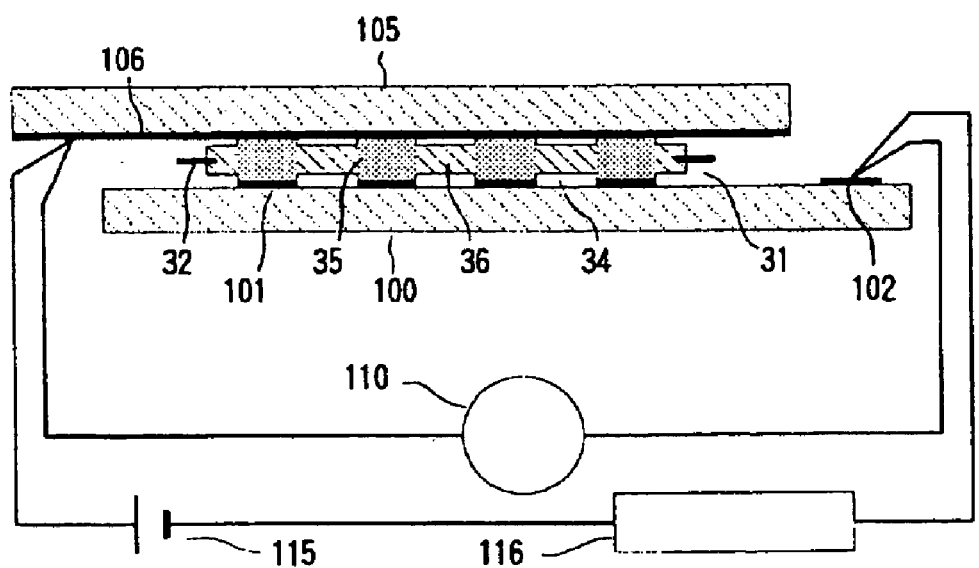
FIG. 11 illustrates the construction of an apparatus for conducting Test 2 in Examples.

Test 2:

One electrode plate 100 for test having a plurality of patterned electrodes 101 formed in accordance with the same pattern as a pattern of the conductive path-forming portions 35 of an anisotropically conductive sheet 31 in a central region on one surface and a plurality of leading electrodes 102 electrically connected to the respective patterned electrodes 101 by a printed wiring (not illustrated) in a peripheral edge region on said one surface, and the other electrode plate 105 for test having a common electrode 106 formed by plating with gold on the whole one surface thereof were provided as illustrated in FIG. 11. The anisotropically conductive sheet 31 was arranged on said one electrode plate 100 for test in a state positioned in such a manner that the conductive path-forming portions 35 thereof are located on the respective patterned electrodes 101 of the one electrode plate 100 for test, and the other electrode plate 105 was arranged on the anisotropically conductive sheet 31. The respective leading electrodes 102 in said one electrode plate 100 for test and the common electrode 106 in the other electrode plate 105 were electrically connected to a voltmeter 110, and in parallel with the voltmeter 110, electrically connected to a DC power source 115 through a constant-current controller 116.

The anisotropically conductive sheet 31 was then pressed in a thickness-wise direction thereof by the other electrode plate 105 for test under an environment of room temperature so as to give a load of 40 g per a conductive path-forming portion 35. After a DC current of 3 A was applied to one of the conductive path-forming portions 35 of the anisotropically conductive sheet 31 for 20 seconds by the DC power source 115 and the constant-current controller 116, voltage of the conductive path-forming portion 35 was measured by the voltmeter 110. This voltage measurement was successively performed on all the conductive path-forming portions 35. Supposing that the DC current applied to the conductive path-forming portion 35 is $I_1$ (=3 A) and a voltage value (V) of the conductive path-forming portion 35 measured is $V_1$, a conduction resistance $R_1$ was found in accordance with the following numerical expression:

$$R_1 = V_1/I_1$$

After the conductive path-forming portions 35 of the anisotropically conductive sheet 31 were pressed 3,000 times in the same manner as in Example 1, a conduction resistance $R_1$ of the anisotropically conductive sheet 31 was found in the same manner as described above. When a value of the conduction resistance $R_1$ is 100 mΩ or lower, an allowable current value of the conductive path-forming portion is 3 A or higher. The average value of the conduction resistance $R_1$ are shown in Table 2.

TABLE 2

| | Test 1 | | | | | | | | | | Test 2 Conduction resistance $R_1$ (mΩ) | |
|---|---|---|---|---|---|---|---|---|---|---|---|---|
| | First cycle | | | | | Three thousandth cycle | | | | | | |
| | Conduction resistance | | | | Minimum value of insulation resistance (Ω) | Conduction resistance | | | | Minimum value of insulation resistance (Ω) | Initial time | After pressing 3000 times |
| | Average value (mΩ) | Maximum value (mΩ) | Minimum value (mΩ) | Coefficient of variation (%) | | Average value (mΩ) | Maximum value (mΩ) | Minimum value (mΩ) | Coefficient of variation (%) | | | |
| Example 1 | 56 | 75 | 43 | 12 | >10 M | 58 | 85 | 45 | 18 | >10 M | 45 | 74 |
| Example 2 | 67 | 88 | 50 | 14 | >10 M | 69 | 94 | 53 | 18 | >10 M | 65 | 88 |
| Example 3 | 61 | 80 | 47 | 16 | >10 M | 61 | 89 | 50 | 19 | >10 M | 60 | 83 |
| Comparative Example 1 | Not possible to measure | | | | 8 | Not tested | | | | | Not tested | |
| Comparative Example 2 | 263 | 376 | 178 | 34 | >10 M | 468 | 589 | 294 | 54 | >10 M | 358 | 687 |
| Comparative Example 3 | 63 | 98 | 44 | 38 | >10 M | 94 | 188 | 61 | 58 | >10 M | 66 | 157 |
| Comparative Example 4 | 107 | 121 | 96 | 18 | >10 M | 110 | 130 | 98 | 25 | >10 M | 103 | 118 |
| Comparative Example 5 | 62 | 82 | 49 | 17 | >10 M | 268 | 242 | 136 | 56 | >10 M | 65 | 489 |

Test 3:

One electrode plate for test having a plurality of patterned electrodes formed in accordance with the same pattern as a pattern of the conductive path-forming portions of an anisotropically conductive sheet on one surface and the other electrode plate for test having an electrode formed by plating with gold on the whole surface thereof were provided. The anisotropically conductive sheet was arranged on said one electrode plate for test in a state positioned in such a manner that the each of the conductive path-forming portions thereof are located on the patterned electrodes of the electrode plate for test, and the other electrode plate was arranged on the anisotropically conductive sheet.

The anisotropically conductive sheet was then pressed in a thickness-wise direction thereof by the other electrode plate for test under an environment of 100° C. so as to give a distortion factor of 10% to the conductive path-forming portions to measure the conduction resistance and insulation resistance of each of the conductive path-forming portions. After the pressing against the anisotropically conductive sheet was held for 3,000 hours, the conduction resistance and insulation resistance of each of the conductive path-forming portions were measured.

The average value, maximum value and minimum value of the conduction resistance, and the minimum value of the insulation resistance at an initial time, and the average value, maximum value and minimum value of the conduction resistance, and the minimum value of the insulation resistance after 3,000 hours elapsed are shown in Table 3.

Figure 12:
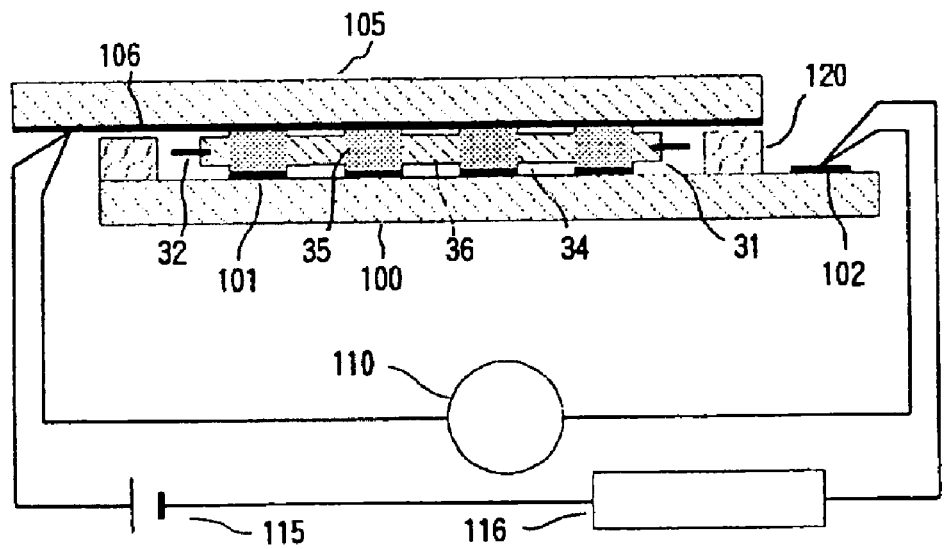
FIG. 12 illustrates the construction of an apparatus for conducting Test 4 in Examples.
Figure 13:
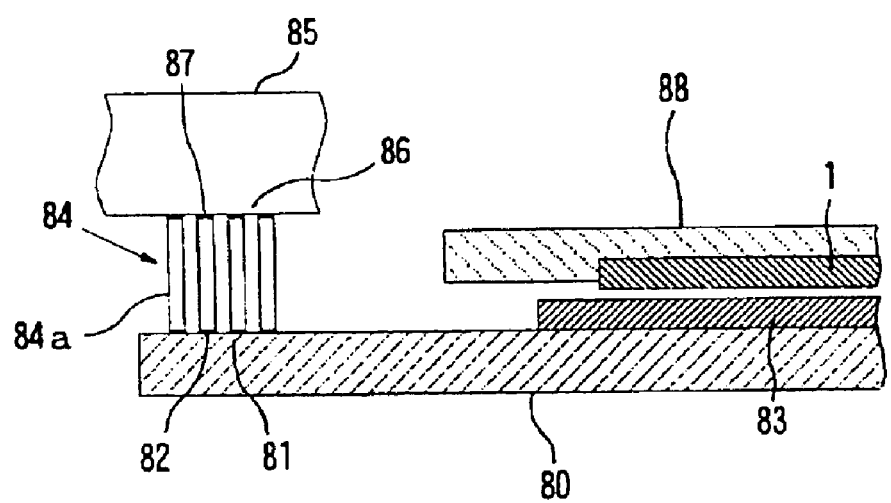
FIG. 13 is a cross-sectional view illustrating the construction of an exemplary conventional wafer inspection apparatus for conducting the WLBI test as to a wafer on which a great number of integrated circuits have been formed.
Figure 14:
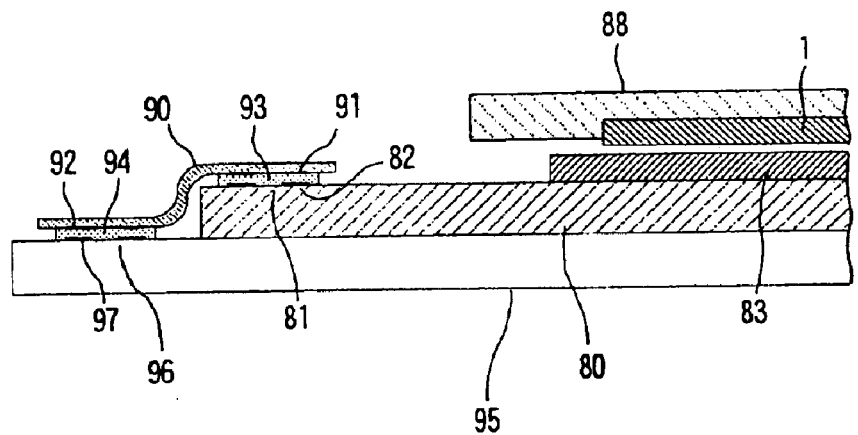
FIG. 14 is a cross-sectional view illustrating the construction of another exemplary conventional wafer inspection apparatus for conducting the WLBI test as to a wafer on which a great number of integrated circuits have been formed.
Figure 15:
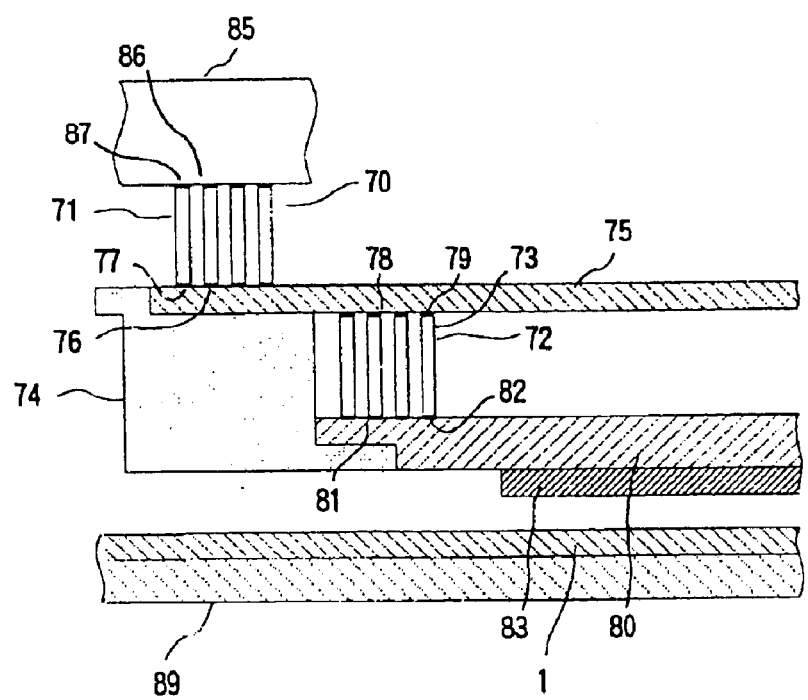
FIG. 15 is a cross-sectional view illustrating the construction of a further exemplary conventional wafer inspection apparatus for conducting the probe test as to a great number of integrated circuits formed on a wafer.

Test 4:

One electrode plate 100 for test having a plurality of patterned electrodes 101 formed in accordance with the same pattern as a pattern of the conductive path-forming portions 35 of an anisotropically conductive sheet 31 in a central region on one surface and a plurality of leading electrodes 102 electrically connected to the respective patterned electrodes 101 by a printed wiring (not illustrated) in a peripheral edge region on said one surface, and the other electrode plate 105 for test having a common electrode 106 formed by plating with gold on the whole one surface thereof were provided as illustrated in FIG. 12. The anisotropically conductive sheet 31 was arranged on said one electrode plate 100 for test in a state positioned in such a manner that the each of the conductive path-forming portions 35 thereof are located on the patterned electrodes 101 of the electrode plate 100 for test, and the other electrode plate 105 was arranged on the anisotropically conductive sheet 31. The respective leading electrodes 102 in said one electrode plate 100 for test and the common electrode 106 in the other electrode plate 105 were electrically connected to a voltmeter 110, and in parallel with the voltmeter 110, electrically connected to a DC power source 115 through a constant-current controller 116. An electrically insulating spacer 120 having a thickness of 90% of the overall thickness of the anisotropically conductive sheet 31 was further arranged between said one electrode plate 100 for test and the other electrode plate 105 for test.

The anisotropically conductive sheet 31 was then pressed in a thickness-wise direction thereof by the other electrode plate 105 for test under an environment of room temperature to bring the common electrode 106 of the other electrode plate 105 for test into contact with the spacer 120. In this state, a distortion factor of the conductive path-forming portions 35 in the anisotropically conductive sheet 31 is 10%. After a DC current of 1 A was then applied to one of the conductive path-forming portions 35 of the anisotropically conductive sheet 31 for 20 seconds by the DC power source 115 and the constant-current controller 116, voltage at the conductive path-forming portion 35 was measured by the voltmeter 110. This voltage measurement was successively performed on all the conductive path-forming portions 35. Supposing that the DC current applied to the conductive path-forming portion 35 is $I_2$ (=1 A) and a voltage value (V) of the conductive path-forming portion 35 measured is $V_2$, a conduction resistance $R_2$ was found in accordance with the following numerical expression:

$$R_2 = V_2/I_2$$

After the conductive path-forming portions 35 of the anisotropically conductive sheet 31 were pressed for 3,000 hours in the same manner as in Example 3, a conduction resistance $R_2$ of the anisotropically conductive sheet 31 was found in the same manner as described above. When a value of the conduction resistance $R_2$ is 100 mΩ or lower, an allowable current value of the conductive path-forming portion 35 is 1 A or higher. The average value of the conduction resistance $R_1$ are shown in Table 3.

TABLE 3

| | Test 3 | | | | | | | | | | Test 4 Conduction resistance $R_1$ (mΩ) | |
|---|---|---|---|---|---|---|---|---|---|---|---|---|
| | Initial time | | | | | After 3,000 hours elapsed | | | | | | |
| | Conduction resistance | | | | Minimum value of insulation resistance (Ω) | Conduction resistance | | | | Minimum value of insulation resistance (Ω) | | After |
| | Average value (mΩ) | Maximum value (mΩ) | Minimum value (mΩ) | Coefficient of variation (%) | | Average value (mΩ) | Maximum value (mΩ) | Minimum value (mΩ) | Coefficient of variation (%) | | Initial time | pressing 3000 times |
| Example 1 | 51 | 76 | 41 | 13 | >10 M | 54 | 80 | 43 | 18 | >10 M | 44 | 59 |
| Example 2 | 65 | 84 | 48 | 14 | >10 M | 74 | 88 | 58 | 19 | >10 M | 63 | 78 |
| Example 3 | 58 | 79 | 45 | 15 | >10 M | 64 | 83 | 53 | 18 | >10 M | 61 | 74 |

TABLE 3-continued

|  | Test 3 | | | | | | | | | | Test 4 Conduction resistance $R_1$ (mΩ) | |
|---|---|---|---|---|---|---|---|---|---|---|---|---|
|  | Initial time | | | | | After 3,000 hours elapsed | | | | | | |
|  | Conduction resistance | | | | Minimum value of insulation resistance (Ω) | Conduction resistance | | | | Minimum value of insulation resistance (Ω) | Initial time | After pressing 3000 times |
|  | Average value (mΩ) | Maximum value (mΩ) | Minimum value (mΩ) | Coefficient of variation (%) | | Average value (mΩ) | Maximum value (mΩ) | Minimum value (mΩ) | Coefficient of variation (%) | | | |
| Comparative Example 1 | — | — | — | — | — | — | — | — | — | — | — | — |
| Comparative Example 2 | — | — | — | — | — | — | — | — | — | — | — | — |
| Comparative Example 3 | — | — | — | — | — | — | — | — | — | — | — | — |
| Comparative Example 4 | — | — | — | — | — | — | — | — | — | — | — | — |
| Comparative Example 5 | 62 | 76 | 47 | 16 | >10 M | 268 | 281 | 261 | 21 | >10 M | 59 | 468 |

As apparent from Tables 2 and 3, it is understood that according to the anisotropically conductive sheets according to Examples 1 to 3, a good electrically connected state is achieved, and the good electrically connected state is stably retained even when the anisotropically conductive sheets are used for a long period of time under a high-temperature environment.

On the other hand, the anisotropically conductive sheets according to Comparative Example 1 was low in electric resistance between the conductive path-forming portions because the sheet body supporting the elastic anisotropically conductive film is composed of covar.

The anisotropically conductive sheets according to Comparative Example 2 was low in conductivity in the thickness-wise direction because the particle diameter of the conductive particles contained in the conductive path-forming portions is small, and the thickness of the coating layer is small.

In the anisotropically conductive sheets according to Comparative Example 3, the electrical resistance in thickness-wise direction was raised when it was used for a long period of time, and thus, could not retain the good electrically connected state because the particle diameter of the conductive particles contained in the conductive path-forming portions is great.

The anisotropically conductive sheets according to Comparative Example 4 could not achieve sufficiently high conductivity in the thickness-wise direction thereof under small pressing force because the durometer hardness of the conductive path-forming portions is high.

The anisotropically conductive sheets according to Comparative Example 5 caused permanent compression set at the conductive path-forming portions when it was used for a long period of time, and thus could not retain a good electrically connected state because the durometer hardness of the conductive path-forming portions is low. In addition, the anisotropically conductive sheet involved a problem that a low-molecular weight component contained in the elastic anisotropically conductive film adheres to electrodes.

EFFECTS OF THE INVENTION

Since each of the anisotropically conductive sheets according to of the present invention has the insulating sheet body whose modulus of elasticity is the specific value, it does not greatly deform when the peripheral edge portion of the insulating sheet body is held, so that positioning operation of the anisotropically conductive sheet to electrodes intended to be connected can be conducted with ease.

Since the insulating sheet body is composed of the material having a low coefficient of linear thermal expansion, a good electrically connected state can be stably retained even in changes of temperature environment.

Since the specific conductive particles are filled in the conductive path-forming portions in the elastic anisotropically conductive film, and the durometer hardness of the conductive path-forming portions falls within the specific range, high conductivity is achieved, and moreover an electrically connected state to electrodes intended to be connected is stably achieved.

Since the electric resistance between the conductive path-forming portions is at least 10 MΩ, high reliability on connection to electrodes intended to be connected is achieved.

Accordingly, the anisotropically conductive sheets according to the present invention can be suitably used in a wafer inspection apparatus.

According to the wafer inspection apparatus of the present invention, as wafer inspection apparatus for conducting electrical inspection of a great number of circuit boards formed on a wafer, the whole apparatus can be miniaturized, the circuit board for inspection is prevented from shortening the service life thereof, a great number of electrodes to be inspected can be inspected collectively, good electrical properties can be achieved, and the wafer inspection apparatus can be applied to electrical inspection as to high functional integrated circuits.

What is claimed is:

1. An anisotropically conductive sheet comprising:
an insulating sheet body, in which a through-hole extending in a thickness-wise direction thereof has been formed, and
an elastic anisotropically conductive film arranged in the through-hole in the insulating sheet body and supported by the inner peripheral edge portion about the through-hole, wherein
the insulating sheet body is composed of a material having a modulus of elasticity of $1 \times 10^8$ to $1 \times 10^{10}$ Pa, a coefficient of linear thermal expansion of $3 \times 10^{-6}$ to $3 \times 10^{-5}$ K$^{-1}$ and a saturation magnetization lower than 0.1 wb/m$^2$, wherein
the elastic anisotropically conductive film is composed of a plurality of conductive path-forming portions each extending in a thickness-wise direction of the film and arranged along a plane direction of the film in a state separated from each other and an insulating portions formed between these conductive path-forming portions, the conductive path-forming portions are obtained by filling conductive particles having a number average particle diameter of 30 to 150 μm and exhibiting magnetism at a high density in an elastic polymeric substance, and a coating layer composed of a noble metal and having a thickness of at least 20 nm is formed on surfaces of the conductive particles, and wherein
each of the conductive path-forming portions has a durometer hardness of 15 to 45, and an electric resistance between conductive path-forming portions adjacent to each other is at least 10 MΩ.

2. An anisotropically conductive sheet comprising:
an insulating sheet body, in which a plurality of through-holes each extending in a thickness-wise direction thereof have been formed, and
a plurality of elastic anisotropically conductive films arranged in the respective through-holes in the insulating sheet body and supported by the inner peripheral edge portions about their corresponding through-holes, wherein
the insulating sheet body is composed of a material having a modulus of elasticity of $1 \times 10^8$ to $1 \times 10^{10}$ Pa, a coefficient of linear thermal expansion of $3 \times 10^{-6}$ to $3 \times 10^{-5}$ K$^{-1}$ and a saturation magnetization lower than 0.1 wb/m$^2$, wherein
each of the elastic anisotropically conductive films is composed of a conductive path-forming portion extending in a thickness-wise direction of the film and an insulating portion formed about the conductive path-forming portion, the conductive path-forming portion is obtained by filling conductive particles having a number average particle diameter of 30 to 150 μm and exhibiting magnetism at a high density in an elastic polymeric substance, and a coating layer composed of a noble metal and having a thickness of at least 20 nm is formed on surfaces of the conductive particles, and wherein
the conductive path-forming portion in each of the elastic anisotropically conductive films has a durometer hardness of 15 to 45, and an electric resistance between the conductive path-forming portions adjacent to each other of elastic anisotropically conductive films is at least 10 MΩ.

3. The anisotropically conductive sheet according to claim 1, wherein an allowable current value of each of the conductive path-forming portions when the conductive path-forming portion is pressed in the thickness-wise direction thereof under a load of 40 g is at least 3 A.

4. The anisotropically conductive sheet according to claim 2, wherein an allowable current value of each of the conductive path-forming portions when the conductive path-forming portion is pressed in the thickness-wise direction thereof under a load of 40 g is at least 3 A.

5. The anisotropically conductive sheet according to claim 1, wherein an allowable current value of each of the conductive path-forming portions when the conductive path-forming portion is pressed in the thickness-wise direction thereof so as to give a distortion factor of 10% is at least 1 A.

6. The anisotropically conductive sheet according to claim 2, wherein an allowable current value of each of the conductive path-forming portions when the conductive path-forming portion is pressed in the thickness-wise direction thereof so as to give a distortion factor of 10% is at least 1 A.

7. The anisotropically conductive sheet according to claim 3, wherein an electric resistance of each of the conductive path-forming portions in the thickness-wise direction thereof as measured in a state that the conductive path-forming portion has been pressed in the thickness-wise direction under a load of 40 g is at most 0.1 Ω, and an electric resistance of the conductive path-forming portion in the thickness-wise direction thereof as measured in a state that the conductive path-forming portion has been pressed in the thickness-wise direction under a load of 40 g, after a cycle that the conductive path-forming portion is pressed for 15 minutes in the thickness-wise direction under a load of 40 g and then held for 5 minutes in an unloaded state in an environment of 100° C. in temperature, was repeated for 3,000 times is at most 0.1 Ω.

8. The anisotropically conductive sheet according to claim 4, wherein an electric resistance of each of the conductive path-forming portions in the thickness-wise direction thereof as measured in a state that the conductive path-forming portion has been pressed in the thickness-wise direction under a load of 40 g is at most 0.1 Ω, and an electric resistance of the conductive path-forming portion in the thickness-wise direction thereof as measured in a state that the conductive path-forming portion has been pressed in the thickness-wise direction under a load of 40 g, after a cycle that the conductive path-forming portion is pressed for 15 minutes in the thickness-wise direction under a load of 40 g and then held for 5 minutes in an unloaded state in an environment of 100° C. in temperature, was repeated for 3,000 times is at most 0.1 Ω.

9. The anisotropically conductive sheet according to claim 5, wherein an electric resistance of each of the conductive path-forming portions in the thickness-wise direction thereof as measured in a state that the conductive path-forming portion has been pressed in the thickness-wise direction so as to give a distortion factor of 10% is at most 0.1 Ω, and an electric resistance of the conductive path-forming portion in the thickness-wise direction thereof as measured after a current of 1 A is applied to the conductive path-forming portion for 3,000 hours in a state that the conductive path-forming portion had been pressed in the thickness-wise direction as to give a distortion factor of 10% in an environment of 100° C. in temperature is at most 0.1 Ω.

10. The anisotropically conductive sheet according to claim 6, wherein an electric resistance of each of the conductive path-forming portions in the thickness-wise direction thereof as measured in a state that the conductive path-forming portion has been pressed in the thickness-wise direction so as to give a distortion factor of 10% is at most 0.1 Ω, and an electric resistance of the conductive path-forming portion in the thickness-wise direction thereof as measured after a current of 1 A is applied to the conductive path-forming portion for 3,000 hours in a state that the conductive path-forming portion had been pressed in the thickness-wise direction so as to give a distortion factor of 10% in an environment of 100° C. in temperature is at most 0.1 Ω.

11. A wafer inspection apparatus for performing electrical inspection of a great number of integrated circuits formed on a wafer, which comprises:

a controller having an input-output terminal part, in which a great number of input-output terminals have been arranged, a circuit board for inspection having a leading terminal part, in which a great number of leading terminals have been arranged on one surface thereof in accordance with a pattern corresponding to a pattern of the input-output terminals in the controller so that the each of the leading terminals is opposed to the respective input-output terminals of the controller, a contact member arranged on said one surface or the other surface of the circuit board for inspection and having a great number of contactors electrically connected to the respective leading terminals through a circuit in the circuit board for inspection and brought into contact with electrodes to be inspected of the integrated circuits on the wafer as an object of the inspection, and a connector arranged between the input-output terminal part of the controller and the leading terminal part of the circuit board for inspection to respectively electrically connect the each of the input-output terminals to the respective leading terminals, wherein the connector is composed of the anisotropically conductive sheet according to any one of claims 1 to 10.

12. The wafer inspection apparatus according to claim 11, wherein the connector is constructed by arranging a plurality of the anisotropically conductive sheets so as to align along the surface of the leading terminal part of the circuit board for inspection.

13. A wafer inspection apparatus for performing electrical inspection of a great number of integrated circuits formed on a wafer, which comprises:

a controller having an input-output terminal part, in which a great number of input-output terminals have been arranged, a circuit board for inspection having a leading terminal part, in which a great number of leading terminals have been arranged, on one surface thereof, a contact member arranged on the other surface of the circuit board for inspection and having a great number of contactors electrically connected to the respective leading terminals through a circuit in the circuit board for inspection and brought into contact with electrodes to be inspected of the integrated circuits on the wafer as an object of the inspection, a circuit board for connection having one-side connecting electrode part, in which a great number of one-side connecting electrodes have been arranged on one surface thereof in accordance with a pattern corresponding to a pattern of the input-output terminals of the controller so that the each of the one-side connecting electrodes is opposed to the respective input-output terminals of the controller, and the other-side connecting electrode part, in which a great number of other-side connecting electrodes have been arranged on the other surface thereof in accordance with a pattern corresponding to a pattern of the leading terminals of the circuit board for inspection so that the each of the other-side connecting electrodes is opposed to the respective leading terminals of the circuit board for inspection, a first connector arranged between the input-output terminal part of the controller and the one-side connecting electrode part of the circuit board for connection to electrically connect the each of the input-output terminals to the respective one-side connecting electrodes, and a second connector arranged between the leading terminal part of the circuit board for inspection and the other-side connecting electrode part of the circuit board for connection to electrically connect the each of the leading terminals to the respective other-side connecting electrodes, wherein either one or both of the first and second connectors are composed of the anisotropically conductive sheet according to any one of claims 1 to 10.

14. A wafer inspection apparatus for performing electrical inspection of a great number of integrated circuits formed on a wafer, which comprises:

a controller having an input-output terminal part, in which a great number of input-output terminals have been arranged, a circuit board for inspection having a leading terminal part, in which a great number of leading terminals have been arranged, on one surface thereof, a contact member arranged on the other surface of the circuit board for inspection and having a great number of contactors electrically connected to the respective leading terminals through a circuit in the circuit board for inspection and brought into contact with electrodes to be inspected of the integrated circuits on the wafer as an object of the inspection, a circuit board for connection having one-side connecting electrode part, in which a great number of one-side connecting electrodes have been arranged on one surface thereof in accordance with a pattern corresponding to a pattern of the input-output terminals of the controller so that the each of the one-side connecting electrodes is opposed to the respective input-output terminals of the controller, and the other-side connecting electrode part, in which a great number of other-side connecting electrodes have been arranged on the other surface thereof in accordance with a pattern corresponding to a pattern of the leading terminals of the circuit board for inspection so that the each of the other-side connecting electrodes is opposed to the respective leading terminals of the circuit board for inspection, a first connector arranged between the input-output terminal part of the controller and the one-side connecting electrode part of the circuit board for connection to electrically connect the each of the input-output terminals to the respective one-side connecting electrodes, and a second connector arranged between the leading terminal part of the circuit board for inspection and the other-side connecting electrode part of the circuit board for connection to electrically connect the each of the leading terminals to the respective other-side connecting electrodes, wherein either one or both of the first and second connectors are constructed by arranging a plurality of the anisotropically conductive sheets according to any one of claims 1 to 10 so as to align along the surface of the one-side connecting electrode part or other-side connecting electrode part of the circuit board for connection.

* * * * *